United States Patent
Huang et al.

(10) Patent No.: US 9,620,607 B2
(45) Date of Patent: Apr. 11, 2017

(54) GATE ALL AROUND DEVICE STRUCTURE AND FIN FIELD EFFECT TRANSISTOR (FINFET) DEVICE STRUCTURE

(71) Applicant: Taiwan Semiconductor Manufacturing Co., Ltd, Hsin-Chu (TW)

(72) Inventors: Yu-Lien Huang, Jhubei (TW); Chin-Chi Wang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/560,644

(22) Filed: Dec. 4, 2014

(65) Prior Publication Data
US 2016/0163810 A1    Jun. 9, 2016

(51) Int. Cl.
| | | |
|---|---|---|
| H01L 29/423 | (2006.01) | |
| H01L 29/78 | (2006.01) | |
| H01L 27/092 | (2006.01) | |
| H01L 29/775 | (2006.01) | |
| H01L 29/10 | (2006.01) | |
| H01L 29/06 | (2006.01) | |
| H01L 29/267 | (2006.01) | |
| H01L 29/165 | (2006.01) | |
| H01L 29/205 | (2006.01) | |

(52) U.S. Cl.
CPC ...... *H01L 29/42392* (2013.01); *H01L 27/092* (2013.01); *H01L 29/1033* (2013.01); *H01L 29/42356* (2013.01); *H01L 29/775* (2013.01); *H01L 29/7827* (2013.01); *H01L 29/7851* (2013.01); *H01L 29/0676* (2013.01); *H01L 29/165* (2013.01); *H01L 29/205* (2013.01); *H01L 29/267* (2013.01); *H01L 2029/7858* (2013.01)

(58) Field of Classification Search
None
See application file for complete search history.

(56) References Cited

U.S. PATENT DOCUMENTS 5,350,709 A * 9/1994 Harada ................. B82Y 10/00
                                                148/DIG. 34
5,989,961 A * 11/1999 Yang .................... H01L 29/812
                                                257/E21.451

(Continued)

*Primary Examiner* — Hoang-Quan Ho
(74) *Attorney, Agent, or Firm* — Birch, Stewart, Kolasch & Birch, LLP

(57) ABSTRACT

A gate all around (GAA) device structure, vertical gate all around (VGAA) device structure, horizontal gate all around (HGAA) device structure and fin field effect transistor (FinFET) device structure are provided. The VGAA device structure includes a substrate and an isolation structure formed in the substrate. The VGAA device structure also includes a first transistor structure formed on the substrate, and the first transistor structure includes a vertical structure. The vertical structure includes a source region, a channel region and a drain region, and the channel region is formed between the source region and the drain region. The channel region has a horizontal portion and a sloped portion sloping downward toward the isolation structure. The VGAA device structure further includes a gate stack structure wrapping around the channel region.

20 Claims, 22 Drawing Sheets

(56) References Cited

U.S. PATENT DOCUMENTS

| | | | |
|---|---|---|---|
| 7,465,998 B2* | 12/2008 | Ono | H01L 29/42384 257/365 |
| 9,123,695 B2* | 9/2015 | Baek | H01L 29/775 |
| 9,136,320 B2* | 9/2015 | Chang | H01L 21/26533 |
| 2006/0063319 A1* | 3/2006 | Ono | H01L 29/42384 438/197 |
| 2014/0054724 A1* | 2/2014 | Ching | H01L 29/42392 257/410 |
| 2014/0183633 A1 | 7/2014 | Chen et al. | |
| 2014/0225184 A1* | 8/2014 | Colinge | H01L 29/7827 257/329 |
| 2014/0299923 A1* | 10/2014 | Chang | H01L 21/26533 257/288 |
| 2014/0367758 A1* | 12/2014 | Izumida | H01L 27/1052 257/314 |
| 2015/0048441 A1* | 2/2015 | Colinge | B82Y 10/00 257/329 |
| 2015/0069330 A1* | 3/2015 | Baek | H01L 29/775 257/29 |
| 2015/0228775 A1* | 8/2015 | Yu | H01L 29/66666 257/329 |
| 2015/0364333 A1* | 12/2015 | Chen | H01L 21/3085 257/329 |
| 2015/0364360 A1* | 12/2015 | Chen | H01L 21/76224 257/506 |
| 2015/0364560 A1* | 12/2015 | Wang | H01L 29/42392 257/288 |
| 2016/0035849 A1* | 2/2016 | Ching | H01L 29/42392 257/27 |

* cited by examiner

GATE ALL AROUND DEVICE STRUCTURE AND FIN FIELD EFFECT TRANSISTOR (FINFET) DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

Multiple gate field-effect transistors (MuGFETs) are a recent development in semiconductor technology which typically are metal oxide semiconductor FETs (MOSFETs) that incorporate more than one gate into a single device. One type of MuGFET is referred to as a FinFET, which is a transistor structure with a fin-like semiconductor channel that is raised vertically away from a substrate of an integrated circuit. A recent design for FinFETs is a gate all around (GAA) FinFET, which has a gate material that surrounds a channel region on all sides.

Although existing MuGFET devices and methods of fabricating MuGFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3K' shows a perspective representation of region A of the FIG. 3K, in accordance with some embodiments of the disclosure.

FIG. 3K-1 shows a cross-section representation along the line $Y_1Y_1'$ of FIG. 3K'.

FIG. 3K-2 shows a cross-section representation along the line $Y_2Y_2'$ of FIG. 3K'.

FIG. 3M-1 shows a cross-section representation along the line $Y_1Y_1'$ of FIG. 3K' after formation of the second gate stack structure, in accordance with some embodiments of the disclosure.

DETAILED DESCRIPTION

Figure 1A:
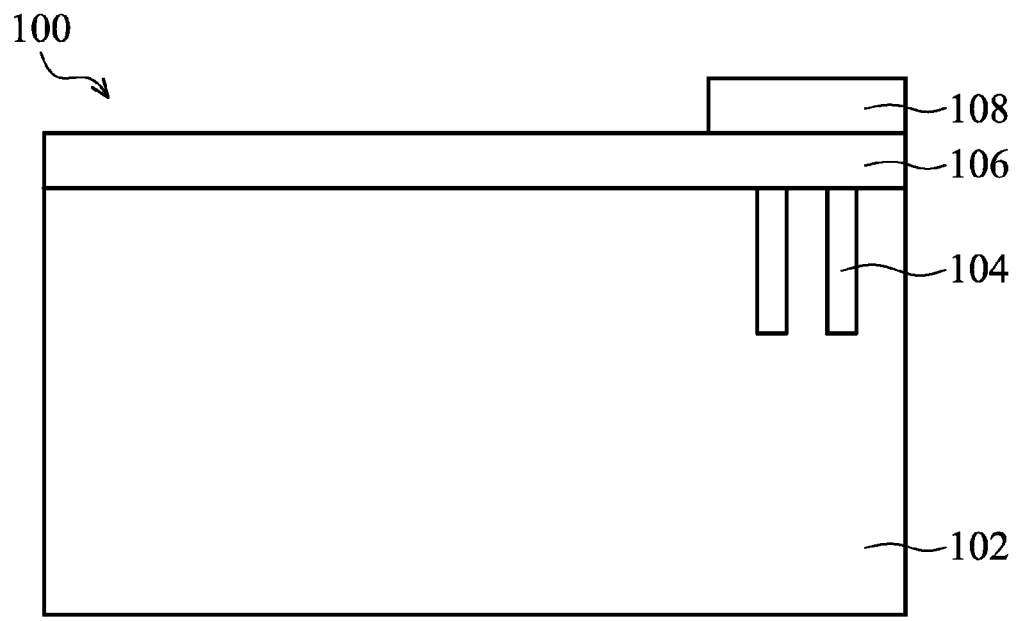
FIGS. 1A-1O show cross-sectional representations of various stages of forming a vertical gate all around (VGAA) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a vertical gate all around (VGAA) device structure, horizontal gate all around (HGAA) device structure and fin field effect transistor (FinFET) device structure are provided. FIGS. 1A-1O show cross-sectional representations of various stages of forming a semiconductor device structure 100, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium (Ge). In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium (SiGe), silicon germanium carbide (SiGeC), gallium arsenic phosphide (GaAsP), or gallium indium phosphide (GaInP). In some embodiments, the substrate 102 includes an epitaxial layer. For example, the substrate 102 has an epitaxial layer overlying a bulk semiconductor. In some other embodiments, the substrate 102 may be a silicon-on-insulator (SOI) or a germanium-on-insulator (GOI) substrate.

Afterwards, a number of alignment marks 104 are formed in the substrate 102. A hard mask layer 106 is formed on the alignment marks 104 and the substrate 102. The hard mask layer 106 may be made of silicon oxide, silicon nitride, silicon oxynitride, or another applicable material.

Afterwards, a photoresist layer 108 is formed on the hard mask layer 106 and patterned to form the patterned photoresist layer 108. In some embodiments, the photoresist layer 108 is patterned by a patterning process. The patterning process includes a photolithography process and an etching process. Photolithography processes include photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1B:
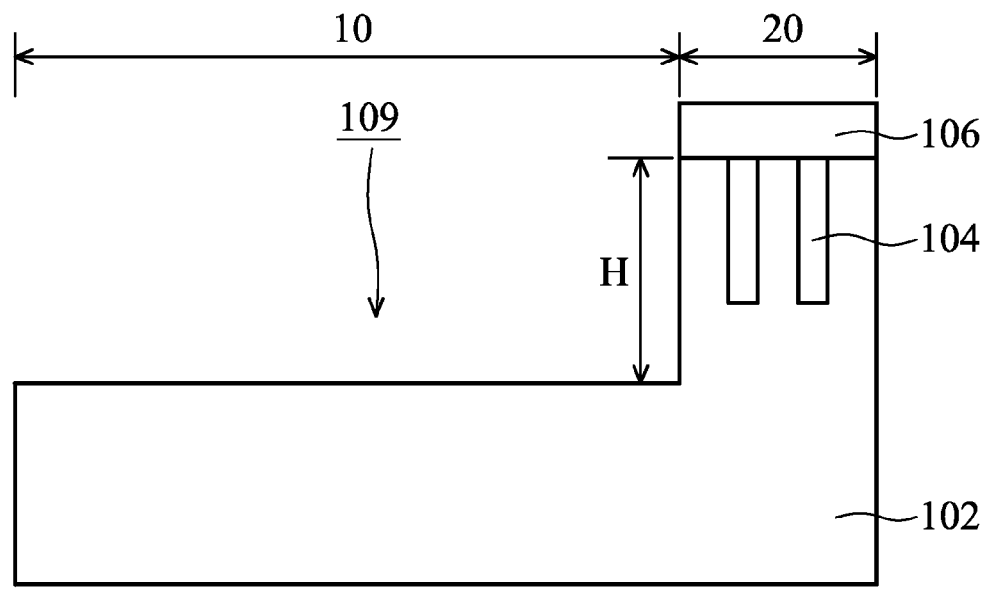

After the photoresist layer 108 is patterned, the hard mask layer 106 is patterned by using the patterned photoresist layer 108 as a mask as shown in FIG. 1B, in accordance with some embodiments of the disclosure. Therefore, the patterned hard mask layer 106 is formed.

Afterwards, a portion of the substrate 102 is removed by using the patterned hard mask layer 106 as a mask. The substrate 102 is removed by an etching process, such as a wet etching process or a dry etching process. As a result, a recess 109 is formed in the substrate 102. The substrate 102 is divided into two regions including a device region 10 and an edge region 20. The recess 109 is formed in the device region 10, and the alignment marks 104 are formed in the edge region 20. It should be noted that a top surface of the substrate 102 in device region 10 is lower than a top surface of the substrate 102 in the edge region 20. The height difference between two top surfaces is marked as height H. In some embodiments, the height H is in a range from about 50 nm to about 300 nm.

Figure 1C:
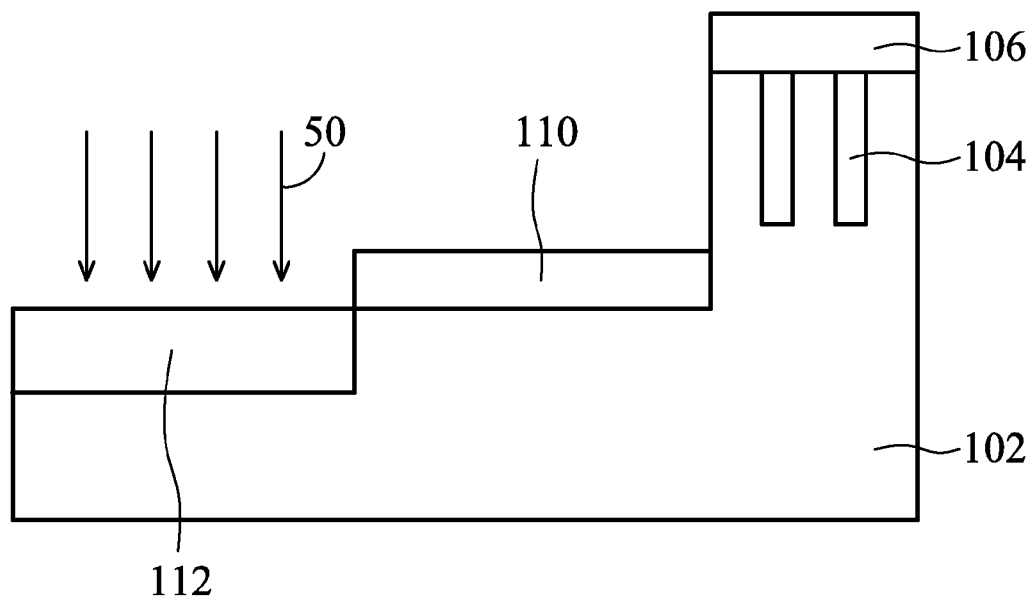

After a portion of the substrate 102 is removed, a photoresist layer 110 is formed on the substrate 102 and then patterned as shown in FIG. 1C, in accordance with some embodiments of the disclosure. The patterned photoresist layer 110 is obtained and it is used to cover the underlying substrate 102. Therefore, a portion of the substrate 102 is exposed.

Afterwards, a first implantation process 50 is performed on the exposed substrate 102 to form a first conductive type well region 112. In some embodiments, the first conductive type well region 112 is an N-type well region.

Figure 1D:
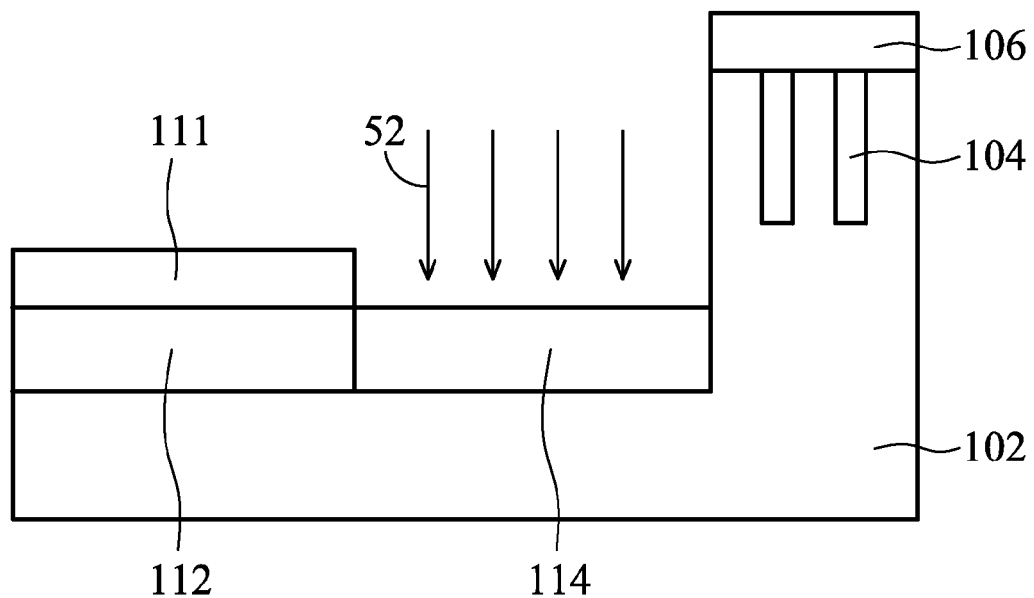

After the first conductive type well region 112 is formed, a photoresist layer 111 is formed on the substrate 102 and then patterned as shown in FIG. 1D, in accordance with some embodiments of the disclosure. The patterned photoresist layer 111 is formed on the first conductive type well region 112 to expose a portion of the substrate 102.

Afterwards, a second implantation process 52 is performed on the exposed substrate 102 to form a second conductive type well region 114 in the substrate 102. The second conductive type well region 114 is adjoined to the first conductive type well region 112. In some embodiments, the second conductive type well region 114 is a P-type well region.

Figure 1E:
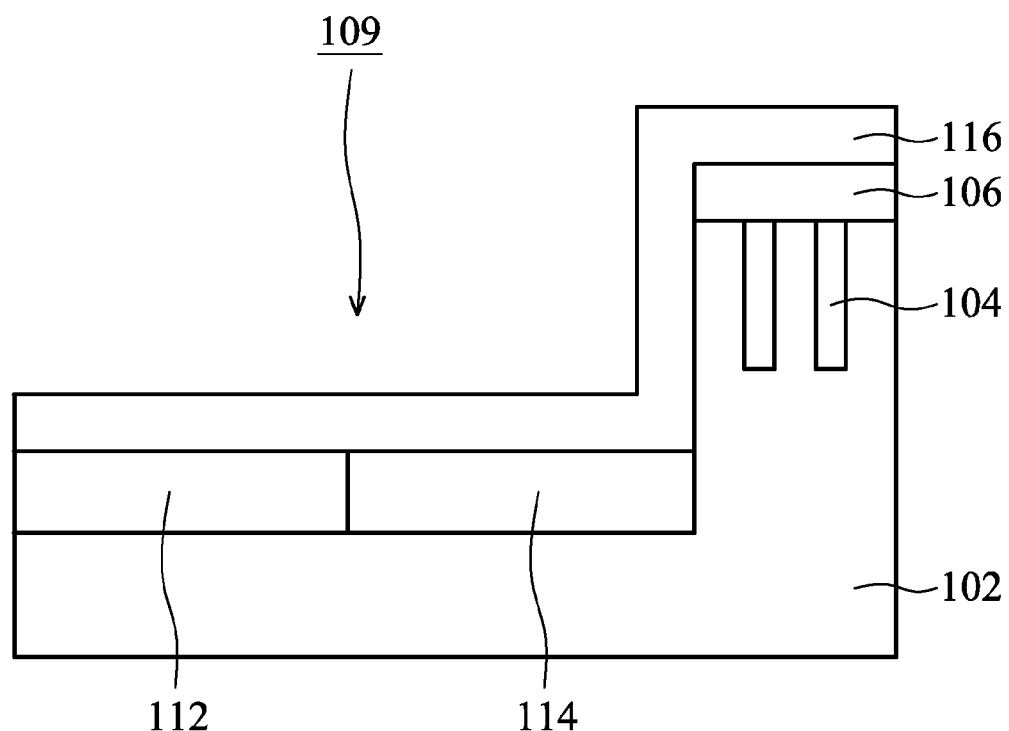

After the second conductive type well region 114 is formed, a spacer 116 is formed on the first conductive type well region 112, the second conductive type well region 114, the hard mask layer 106, and the substrate 102 as shown in FIG. 1E, in accordance with some embodiments of the disclosure. It should be noted that the spacer 116 is formed on a bottom portion and sidewall portion of the recess 109.

The spacer 116 is made of silicon oxide, silicon nitride, silicon oxynitride or other applicable material. In some embodiments, the spacers 116 are formed by an atomic layer deposition (ALD) process, a plasma enhanced atomic layer deposition (PEALD) process or a low pressure chemical vapor deposition (LPCVD).

Figure 1F:
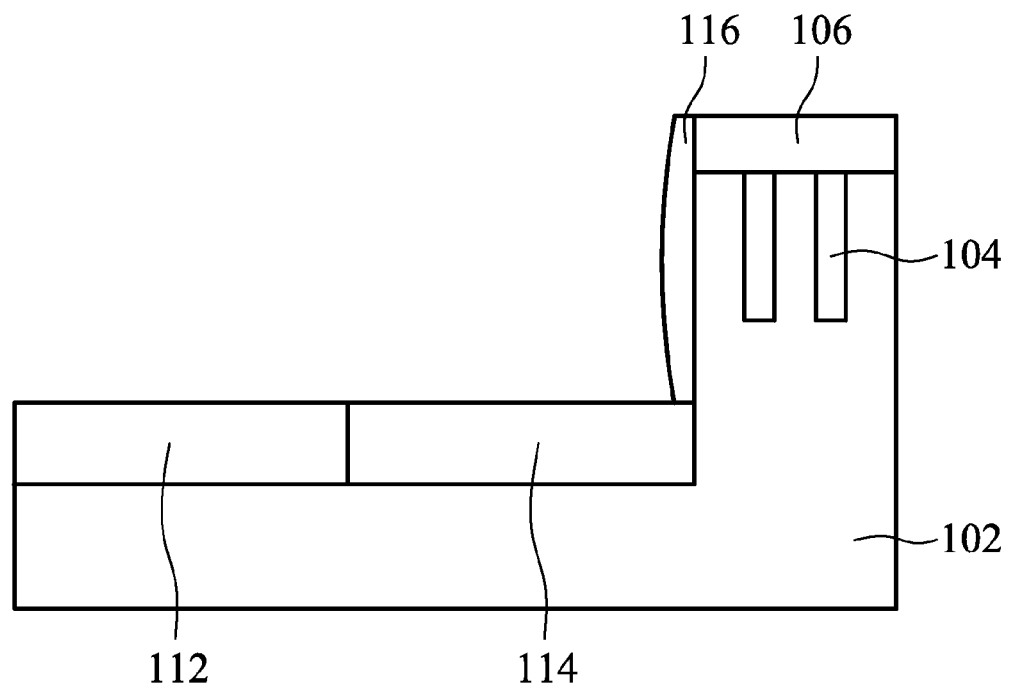

After the spacer 116 is formed, a portion of the spacer 116 is removed by a dry etching process as shown in FIG. 1F, in accordance with some embodiments of the disclosure. The remaining spacer 116 is formed on the sidewall portion of the recess 109.

Figure 1G:
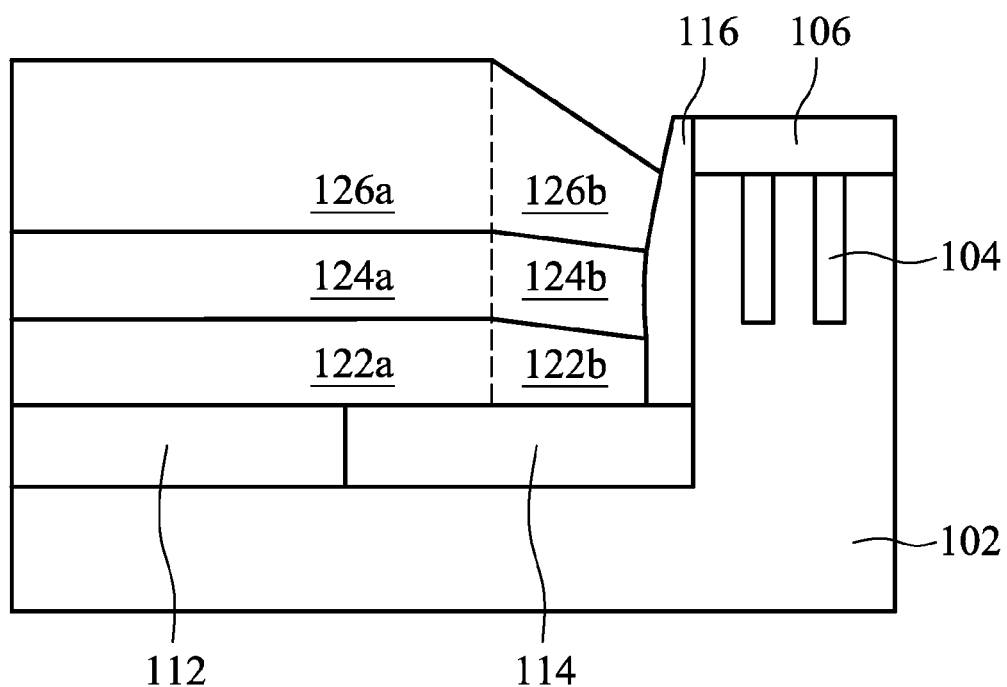

After the dry etching process, a first semiconductor material 122, a second semiconductor material 124 and the third semiconductor material 126 are sequentially formed on the first conductive type well region 112 and the second conductive type well region 114 as shown in FIG. 1G, in accordance with some embodiments of the disclosure. In some embodiments, the first semiconductor material 122 is an epitaxial material. In some embodiments, the second semiconductor material 124 is an epitaxial material. In some embodiments, the third semiconductor material 126 is an epitaxial material.

In some embodiment, the first semiconductor material 122, the second semiconductor material 124 and the third semiconductor material 126 are formed separately. In some embodiments, two materials of the first semiconductor material 122 and the second semiconductor material 124, the first semiconductor material 122 and third semiconductor material 126, or the second semiconductor material 124 and the third semiconductor material 126 are formed by an epitaxial process. In some other embodiments, the first semiconductor material 122, the second semiconductor material 124 and the third semiconductor material 126 are formed by an epitaxial process.

It should be noted that because the spacer 116 is a dielectric/amorphous layer, the growth rate of a portion of the first semiconductor material 122 which is formed on the spacer 116 is slower than that which is formed on the first conductive type well region 112 or the second conductive type well region 114. Therefore, the first semiconductor material 122 has a horizontal portion 122a and a sloped portion 122b sloping downward towards the spacer 116.

In addition, since the second semiconductor material 124 is formed on the first semiconductor material 122, the growth shape of the second semiconductor material 124 lines along the shape of the first semiconductor material 122. Therefore, the second semiconductor material 124 also has a horizontal portion 124a and a sloped portion 124b sloping downward towards the spacer 116. Furthermore, the third semiconductor material 126 has a horizontal portion 126a and a sloped portion 126b sloping downward towards the spacer 116.

The first semiconductor material 122, the second semiconductor material 124 and the third semiconductor material 126 each independently include Si, Ge, SiGe, SiC, InSb, InAs, GaAs, GaSb, InGaSb, InGaAs, or combinations thereof.

Figure 1H:
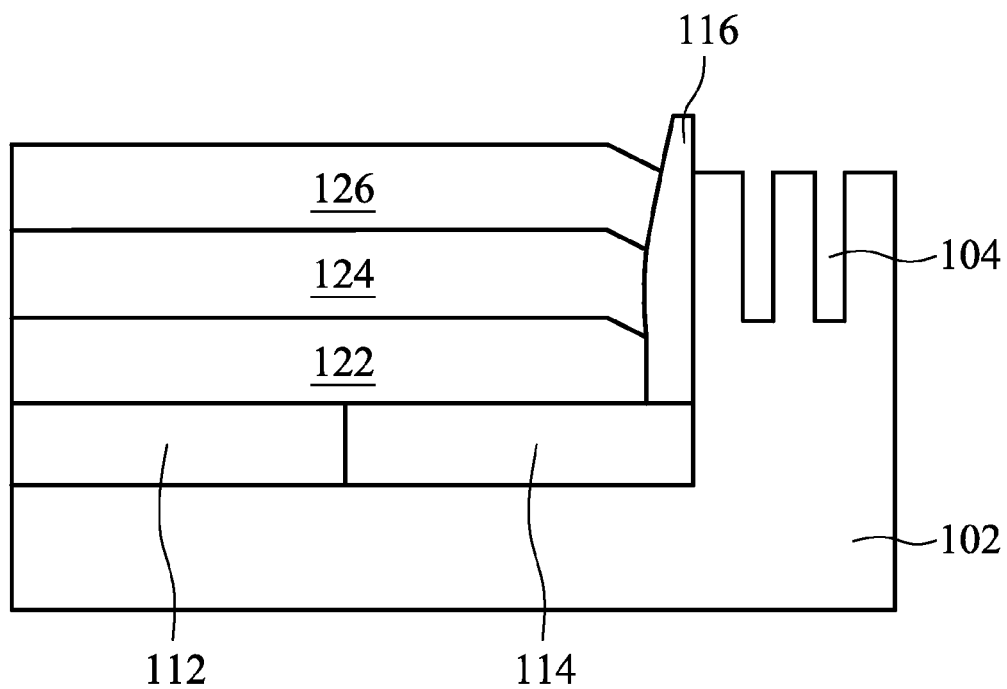

After the third semiconductor material 126 is formed, a polishing process is performed on the third semiconductor material 126 as shown in FIG. 1H, in accordance with some embodiments of the disclosure. Afterwards, the hard mask layer 106 is removed.

Figure 1I:
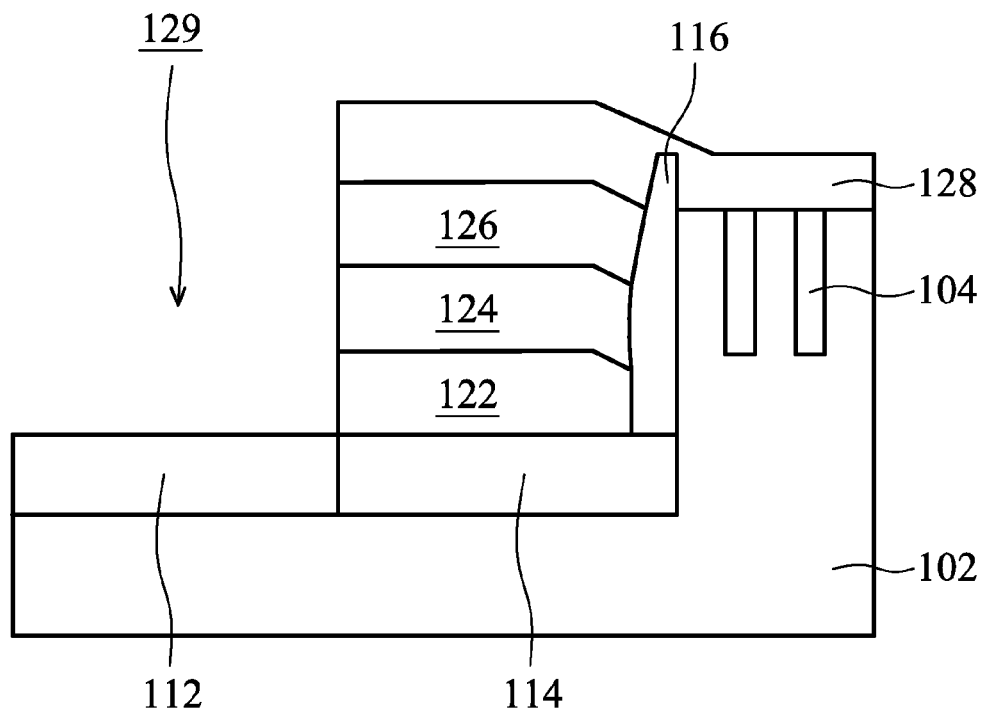

Afterwards, a hard mask layer 128 is formed on the third semiconductor material 126 as shown in FIG. 1I, in accordance with some embodiments of the disclosure. The hard mask layer 128 is then patterned to cover a portion of the first semiconductor material 122, the second semiconductor material 124 and the third semiconductor material 126. Afterwards, a portion of the second semiconductor material 124 and a portion of the third semiconductor material 126 are removed to form a recess 129 on the first conductive type well region 112.

Figure 1J:
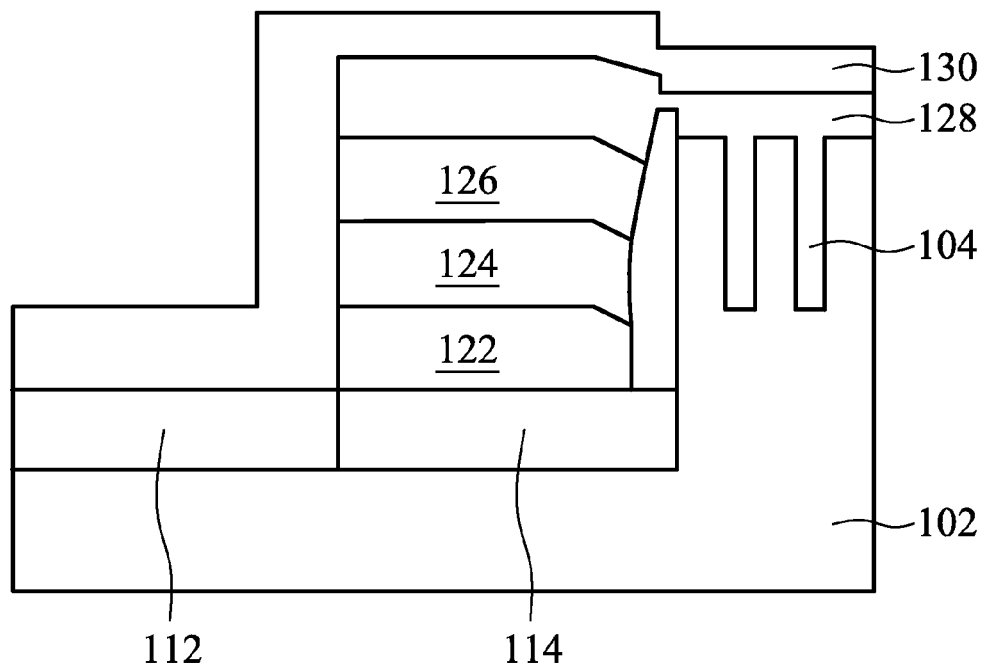

After the second recess 129 is formed, a second spacer 130 is formed on a bottom portion and sidewall portion of the second recess 129 as shown in FIG. 1J, in accordance with some embodiments of the disclosure. In addition, the second spacer 130 is formed on the hard mask layer 128.

Figure 1K:
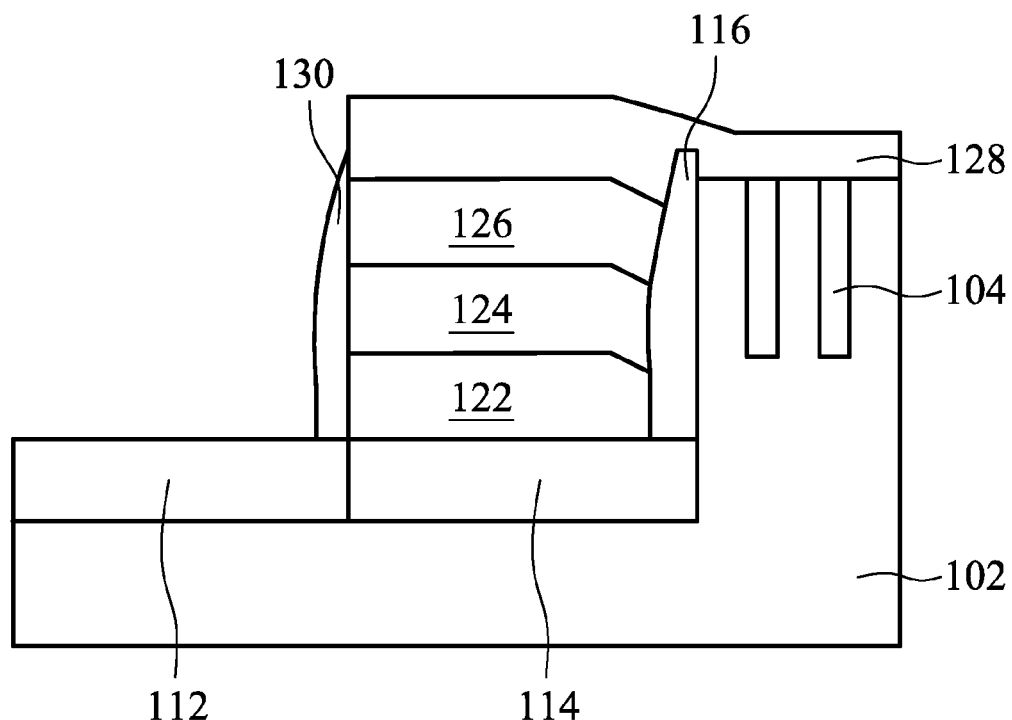

Afterwards, a portion of the second spacer 130 is removed as shown in FIG. 1K, in accordance with some embodiments of the disclosure. As a result, the second spacer 130 is formed on the sidewall portions of the first semiconductor material 122, the remaining second semiconductor material 124 and the third semiconductor material 126. In some embodiments, the second spacer 130 is made of silicon nitride (SiNx), silicon oxide (SiO$_2$), silicon carbon nitride (SiCN) or the like.

Figure 1L:
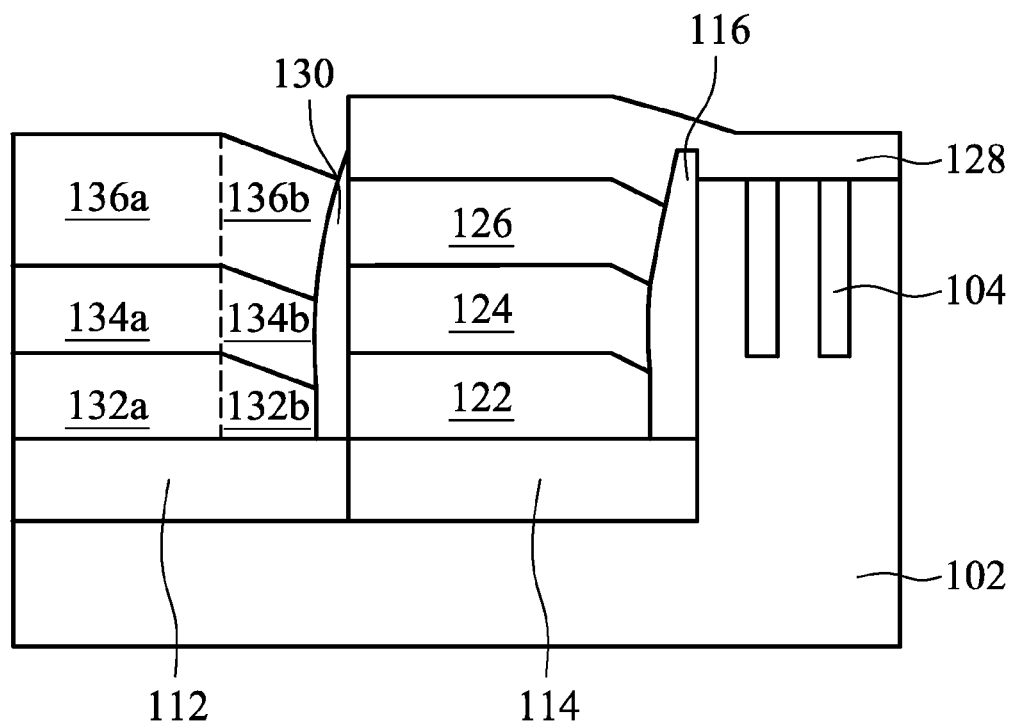

Afterwards, a fourth semiconductor material 132, a fifth semiconductor material 134 and a sixth semiconductor material 136 are formed on the first conductive type well region 112 and on the second spacer 130 as shown in FIG. 1L, in accordance with some embodiments of the disclosure. The fourth semiconductor material 122, the fifth semiconductor material 134 and the sixth semiconductor material 136 independently includes Si, Ge, SiGe, SiC, InSb, InAs, GaAs, GaSb, InGaSb, InGaAs, or combinations thereof. In some embodiments, the fourth semiconductor material 132, the fifth semiconductor material 134 and the sixth semiconductor material 136 are formed by the epitaxial processes.

In some embodiments, the first semiconductor material 132 is an epitaxial material. In some embodiments, the second semiconductor material 134 is an epitaxial material. In some embodiments, the third semiconductor material 136 is an epitaxial material.

In some embodiment, the first semiconductor material 122, the second semiconductor material 124 and the third semiconductor material 126 are formed separately. In some embodiments, two materials of the first semiconductor material 122 and the second semiconductor material 124, the first semiconductor material 122 and third semiconductor material 126, or the second semiconductor material 124 and the third semiconductor material 126 are formed by an epitaxial process. In some other embodiments, the first semiconductor material 122, the second semiconductor material 124 and the third semiconductor material 126 are formed by an epitaxial process.

Like the first semiconductor material 122, the fourth semiconductor material 132 has a horizontal portion 132a and a sloped portion 132b sloping downward towards the second spacer 130. In addition, the fifth semiconductor material 134 has a horizontal portion 134a and a sloped portion 134b sloping downward towards the second spacer 130. The sixth semiconductor material 136 has a horizontal portion 136a and a sloped portion 136b sloping downward towards the second spacer 130.

Figure 1M:
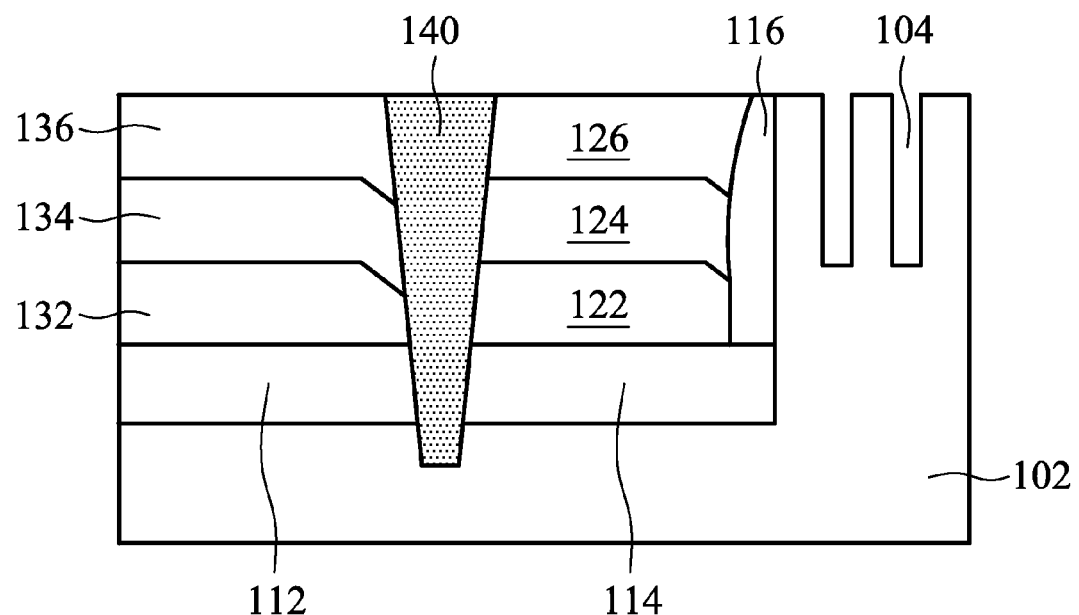

Afterwards, a polishing process is performed on the sixth semiconductor material 136, and the hard mask layer 128 is removed. Afterwards, an isolation structure 140 is formed between the first semiconductor material 122 and the fourth semiconductor material 132 as shown in FIG. 1M, in accordance with some embodiments of the disclosure.

Figure 1N:
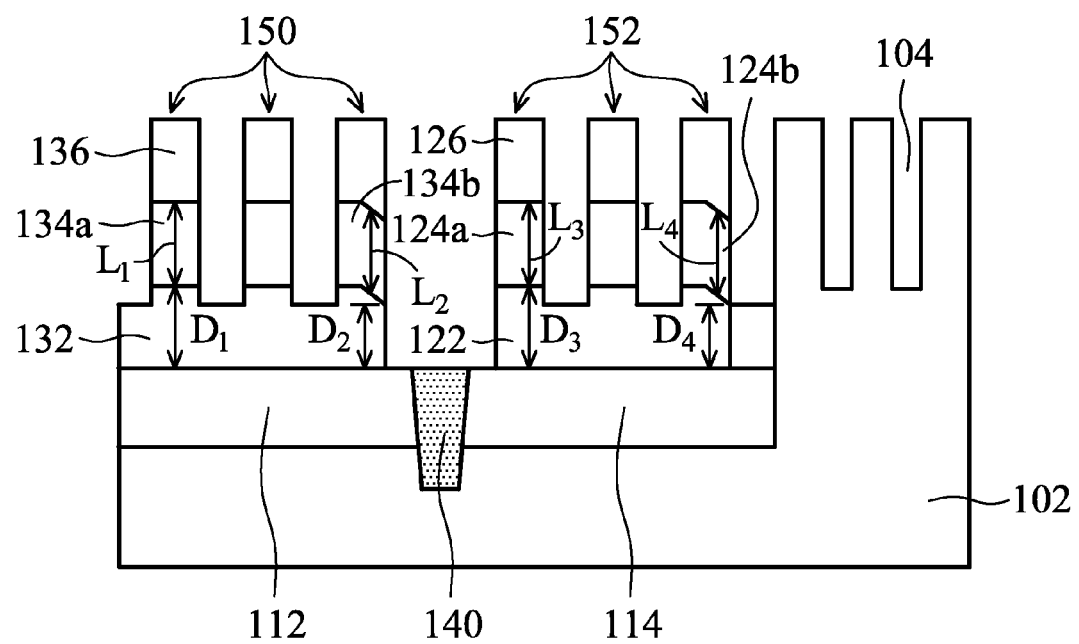
Figure 1O:
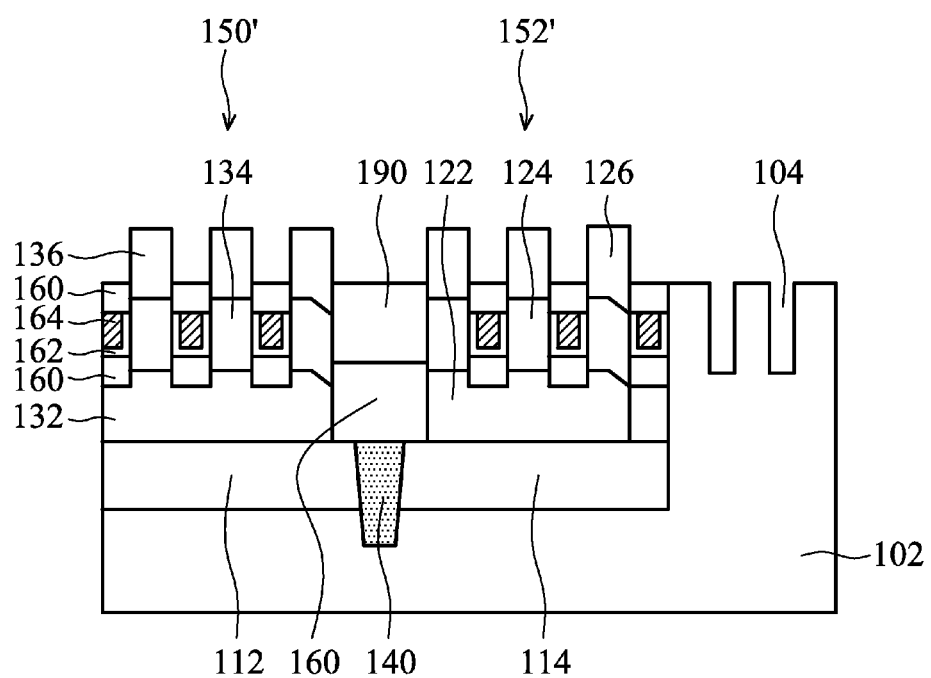

Afterwards, a portion of the fourth semiconductor material 132, a portion of the fifth semiconductor 134 and a portion of the sixth semiconductor material 136 are removed to form a number of first vertical structures 150, and a portion of the first semiconductor material 122, a portion of the second semiconductor material 124 and a portion of the third semiconductor material 126 are removed to form a number of second vertical structures 152 as shown in FIG. 1N, in accordance with some embodiments of the disclosure.

In the first vertical structures 150, a number of stack structures including the fourth semiconductor material 132, the fifth semiconductor material 134 and the sixth semiconductor material 136. The fourth semiconductor material 132 is used as a source region, the fifth semiconductor material 134 is used as a channel region, and the sixth semiconductor material 136 is used as a drain region. The channel region is formed between the source region and the drain region.

In the second vertical structures 152, there are a number of stack structures that include the first semiconductor material 122, the second semiconductor material 124 and the third semiconductor material 126. The first semiconductor material 122 is used as a source region, the second semiconductor material 124 is used as a channel region, and the third semiconductor material 126 is used as a drain region.

As shown in FIG. 1N, in the first vertical structures 150, a first distance $D_1$ between the horizontal portion 134a of the fifth semiconductor material 134 (also called as the channel region) and the substrate 102 is greater than a second distance $D_2$ between sloped portion 134b of the fifth semiconductor material 134 and the substrate 102. In the second vertical structures 152, a third distance $D_3$ between the horizontal portion 124a of the second semiconductor material 124 (also called as the channel region) and the substrate 102 is greater than a fourth distance $D_4$ between the sloped portion 124b of the second semiconductor material 124 and the substrate 102.

After the first vertical structures 150 and the second vertical structures 152 are formed, a gate stack structure is formed in a space between two adjacent first vertical structures 150 and 152 as shown in FIG. 1O, in accordance with some embodiments of the disclosure.

The gate stack structure wraps around the channel region (such as the fifth semiconductor material 134 or the second semiconductor material 124) to form a gate all around (GAA) device (transistor). In other words, the gate stack structure encircles the channel region. The gate stack structure includes an interfacial layer (IL) (not shown), a high-k dielectric layer 162 and a metal gate electrode 164.

The ILD layer 190 is formed over the isolation structure 140 as shown in FIG. 1O, and may include silicon oxide, silicon nitride, silicon oxynitride, or combinations thereof. The high-k dielectric layer 162 may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like. The metal gate electrode 164 may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), or zirconium (Zr). The P-work-function metal includes titanium nitride (TiN), tungsten nitride (WN), tantalum nitride (TaN), or ruthenium (Ru).

In addition, gate spacers 160 are formed between the source region and the high-k dielectric layer 162, and between the drain region and the metal gate electrode 164.

As shown in FIG. 1O, a first transistor structure 150' is formed on the first conductive type well region 112, and a second transistor structure 152' is formed on the second conductive type well region 114. In some embodiments, the first transistor structure 150' is a PMOS transistor structure and the second transistor structure 152' is an NMOS transistor structure. In some embodiments, because the epitaxial process for forming the first semiconductor material 122 and the fourth semiconductor material 132 is performed before the formation of the isolation structure, the fabrication processes from FIG. 1A to FIG. 1O are called an epi first process.

It should be noted that the spacer 130 (such as silicon nitride) is formed on the sidewall portion of the first semiconductor material 122, the second semiconductor material 124 and the third semiconductor material 126. As a result, the fourth semiconductor material 132, the fifth semiconductor material 134 and sixth semiconductor material 136 do not tend to form on the spacer 130. Therefore, the fourth semiconductor material 132, the fifth semiconductor material 134 and the sixth semiconductor material 136 respectively have sloped portions sloping downward toward the spacer 130.

It should be noted that if no spacer formed adjacent to the sidewall of the first semiconductor material, the fourth semiconductor material may have a sloped portion sloping upward to the first semiconductor material. Likewise, the fifth semiconductor material which is used as a channel region also has an upward-sloping portion. The upward sloped portion has a smaller slope than the downward-sloping portion of the disclosure. However, the slope of the upward-sloping portion is smoothly changed for a wide range. Therefore, a spatial non-uniform channel length (Lg) is obtained when no spacer is formed adjacent to the sidewall portion of the first semiconductor material, the second semiconductor material and third semiconductor material. Compared with the upward-sloping portion, the slope of the downward-sloping portion of the disclosure is rapidly changed for a small range. With the spacer design, the downward-sloping portion of the disclosure is shorter and the uniform channel length (Lg) is obtained.

Referring to FIG. 1N again, the horizontal portion 134a of the fifth semiconductor material 134 (or called as the channel region) has a first channel length $L_1$, and the sloped portion 134b of the fifth semiconductor material 134 has a second channel length $L_2$. In some embodiments, a ratio ($L_1/L_2$) of the first channel length $L_1$ to the second channel length $L_2$ is in a range from about 30% to about 95%. Compared with the channel region having upward-sloping portion, a special channel length uniformity is improved by the downward-sloping channel portion.

The horizontal portion 124a of the second semiconductor material 124 (or called as the channel region) has a third channel length $L_3$, and the sloped portion 124b of the second semiconductor material 124 has a fourth channel length $L_4$. In some embodiments, a ratio ($L_3/L_4$) of the third channel length $L_3$ to the fourth channel length $L_4$ is in a range from about 30% to about 95%.

Figure 2A:
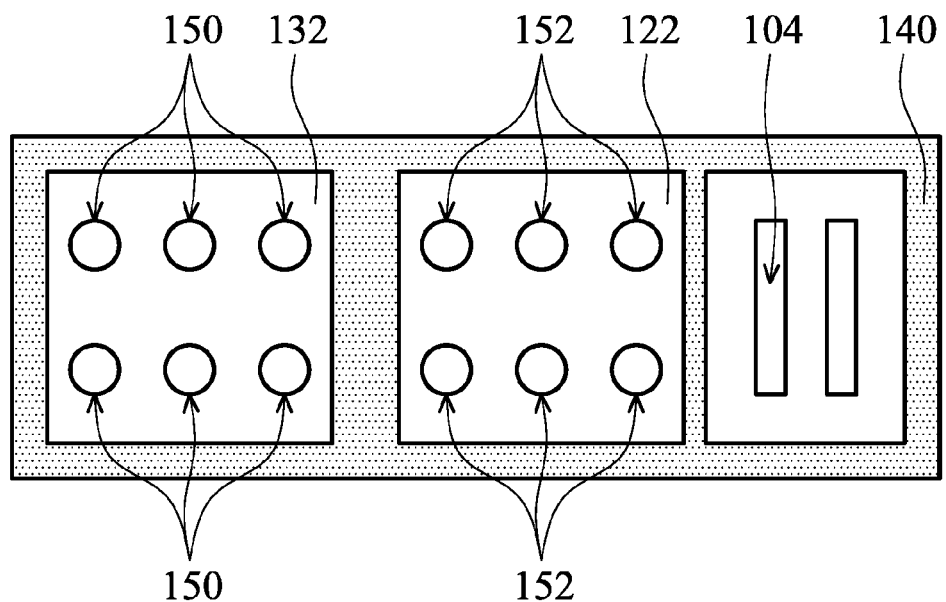
FIG. 2A-2C show top-view representations of the first vertical structures and the second vertical structures, in accordance with some embodiments of the disclosure.

FIG. 2A shows a top-view representation of the first vertical structures 150 and the second vertical structures 152, in accordance with some embodiments of the disclosure. Each of the first vertical structures 150 and the second vertical structures 152 has a circular shape and is called a nanowire.

Figure 2B:
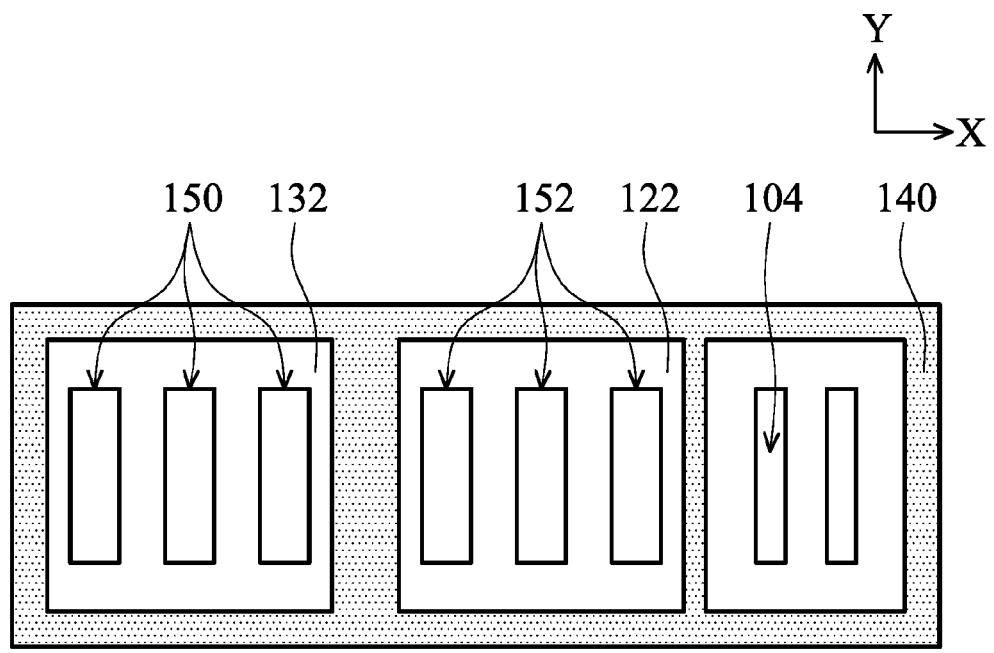

FIG. 2B shows a top-view representation of the first vertical structures 150 and the second vertical structures 152, in accordance with some embodiments of the disclosure. As shown in FIG. 2B, each of the first vertical structures 150 and the second vertical structures 152 has a bar-like shape along the Y-axis.

Figure 2C:
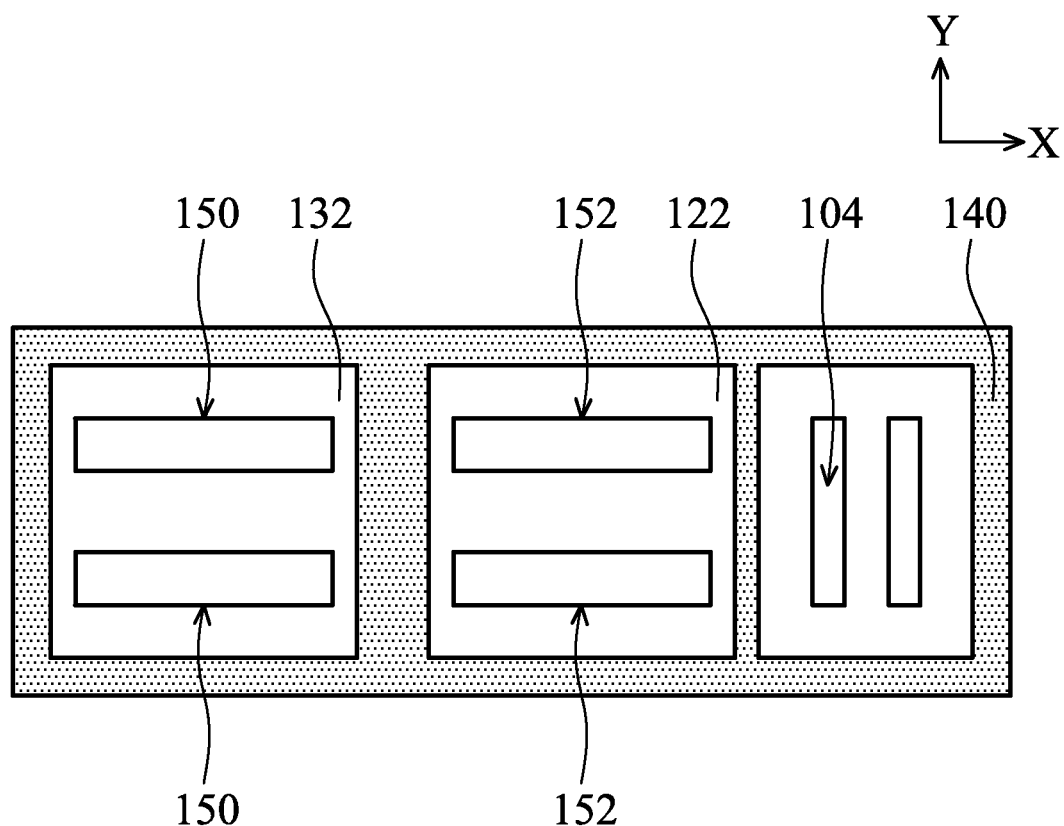

FIG. 2C shows a top-view representation of the first vertical structures 150 and the second vertical structures 152, in accordance with some embodiments of the disclosure. As shown in FIG. 2B, each of the first vertical structures 150 and the second vertical structures 152 has a bar-like shape along the X-axis.

FIGS. 3A-3M show cross-sectional representations of various stages of forming a horizontal gate all around (HGAA) device structure 200, in accordance with some embodiments of the disclosure.

Figure 3A:
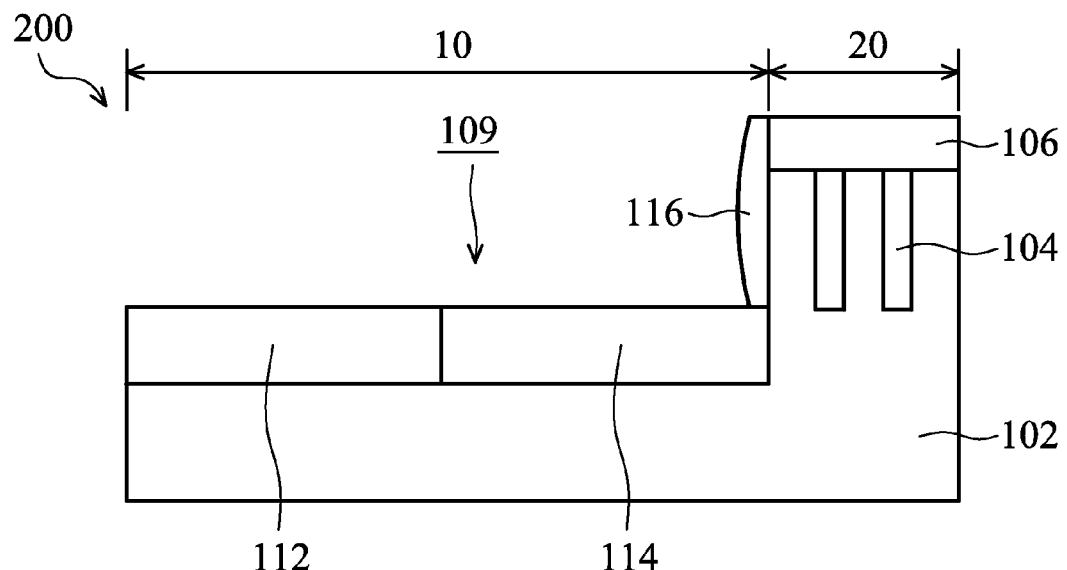
FIGS. 3A-3M show cross-sectional representations of various stages of forming a horizontal gate all around (HGAA) device structure, in accordance with some embodiments of the disclosure.

Referring to FIG. 3A, the substrate 102 is divided into the device region 10 and the edge region 20. The first conductive type well region 112 and the second conductive type well region 114 are formed in the device region 10. The alignment marks 104 are formed in the edge region 20, and the hard mask layer 106 is formed on the alignment marks 104. The recess 109 is formed in the device region 10, and a spacer 116 is formed on the sidewall portion of the recess 109.

Figure 3B:
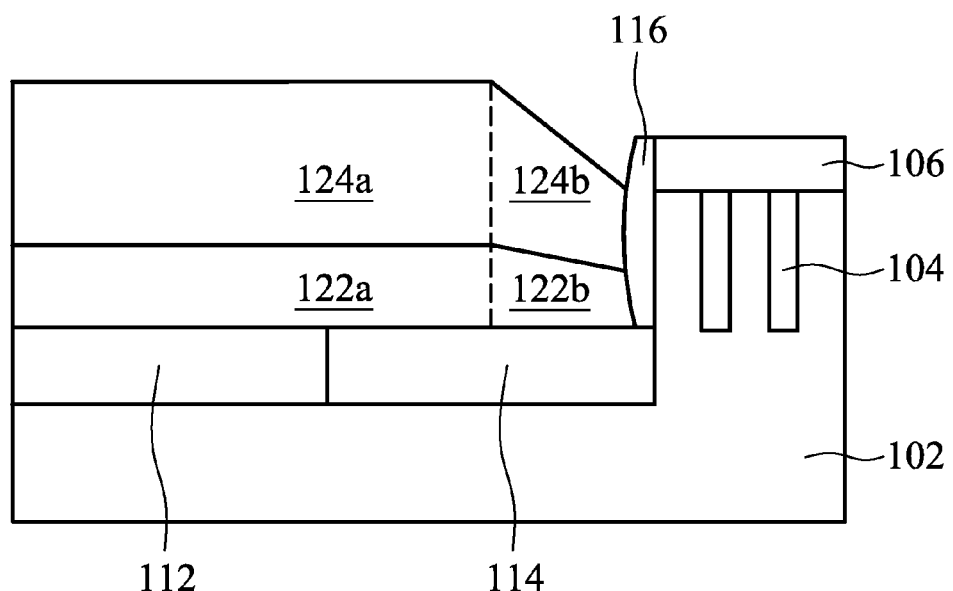

Afterwards, the first semiconductor material 122 and the second semiconductor material 124 are formed on the first conductive type well region 112 and the second conductive type well region 114 as shown in FIG. 3B, in accordance with some embodiments of the disclosure.

It should be noted that the first semiconductor material 122 is formed by an epitaxial process, and it has a horizontal portion 122a and a sloped portion 122b sloping downward toward the spacer 116. Like the first semiconductor material 122, the second semiconductor material 124 also has a horizontal portion 124a and a sloped portion 124b sloping downward toward the spacer 116.

Figure 3C:
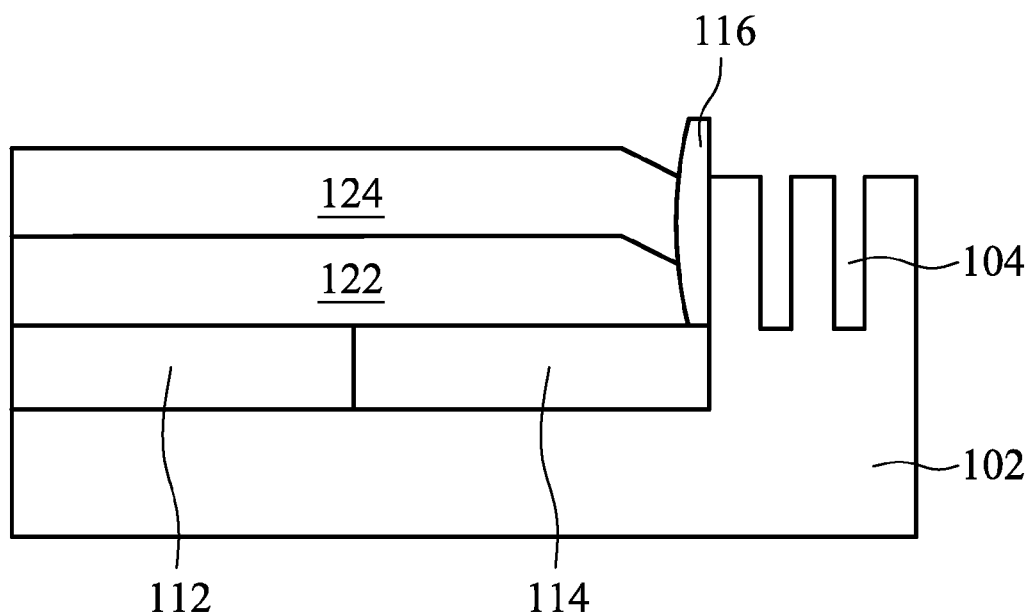

After the second semiconductor material 124 is formed, a polishing process is performed on the second semiconductor material 124 as shown in FIG. 3C, in accordance with some embodiments of the disclosure. Afterwards, the hard mask layer 106 is removed.

Figure 3D:
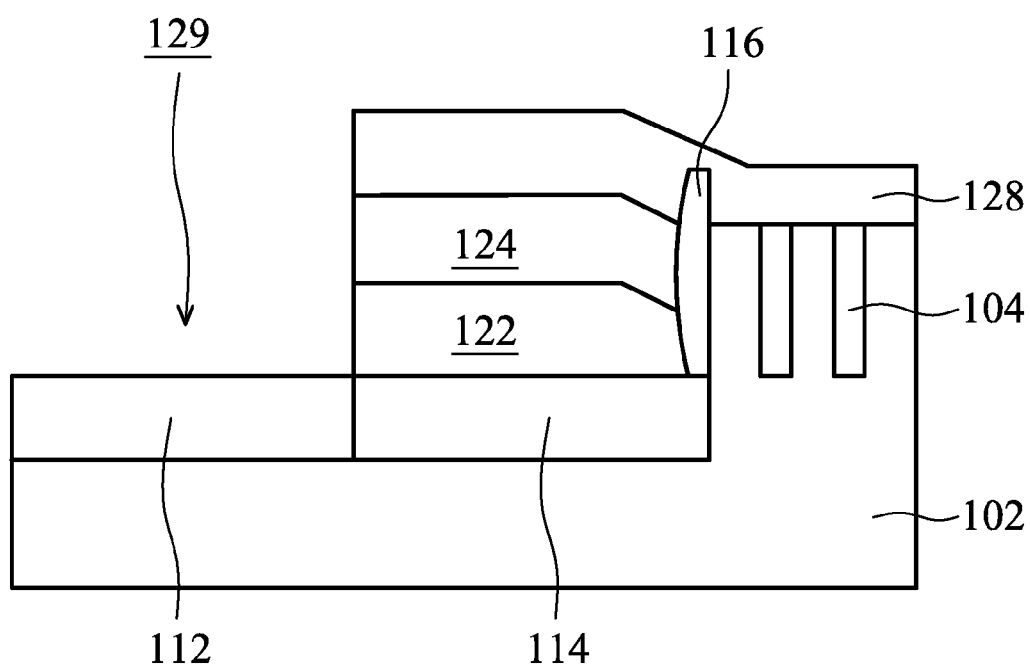

Afterwards, the hard mask layer 128 is formed on the second semiconductor material 124 and patterned as shown in FIG. 3D, in accordance with some embodiments of the disclosure. Afterwards, a portion of the first semiconductor material 122 and the second semiconductor material 124 are removed to form the recess 129.

Figure 3E:
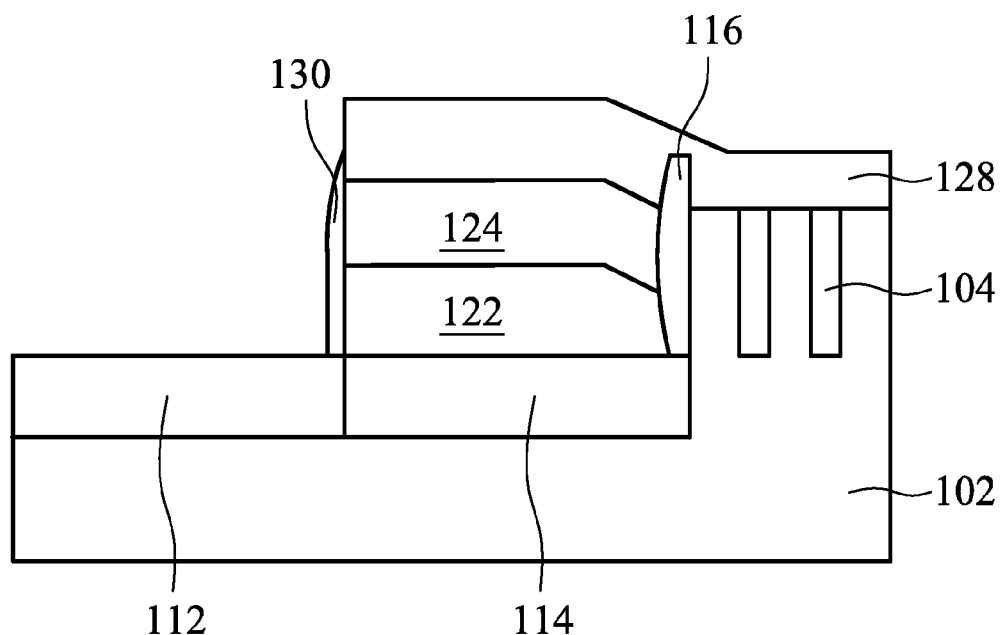

After the recess 129 is formed, the second spacer 130 is formed on the sidewall of the first semiconductor material 122 and the second semiconductor material 124 as shown in FIG. 3E, in accordance with some embodiments of the disclosure.

Figure 3F:
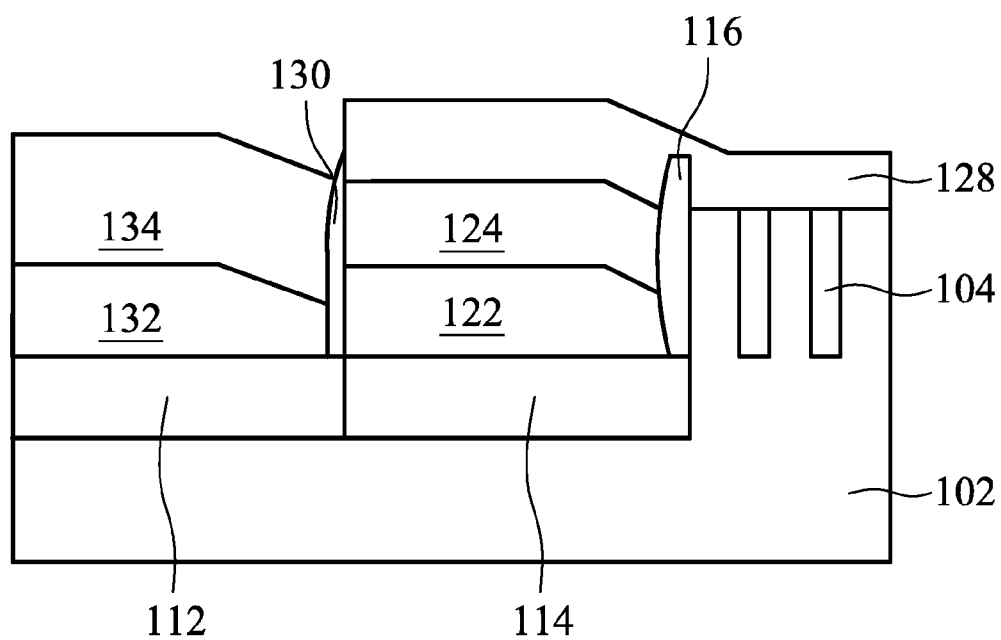

After the second spacer 130 is formed, the fourth semiconductor material 132 and the fifth semiconductor material 134 are formed on the first conductive type well region 112 as shown in FIG. 3F, in accordance with some embodiments of the disclosure. It should be noted that the fourth semiconductor material 132 has a horizontal portion 132a and a sloped portion 132b, and the fifth semiconductor material 134 has a horizontal portion 134a and a sloped portion 134b.

Figure 3G:
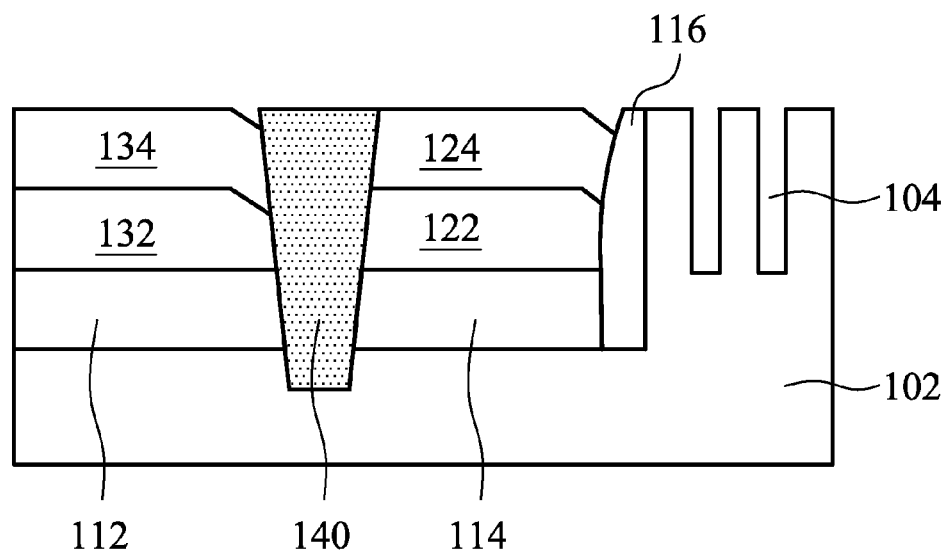

Afterwards, a polishing process is performed on the fifth semiconductor material 134, and the hard mask layer 128 is removed. Afterwards, the isolation structure 140 is formed between the first semiconductor material 122 and the fourth semiconductor material 132 as shown in FIG. 3G, in accordance with some embodiments of the disclosure. A fin structure is made of the first semiconductor material 122 and the second semiconductor material 124, and another fin structure is made of the fourth semiconductor material 132 and the fifth semiconductor material 134.

Figure 3H:
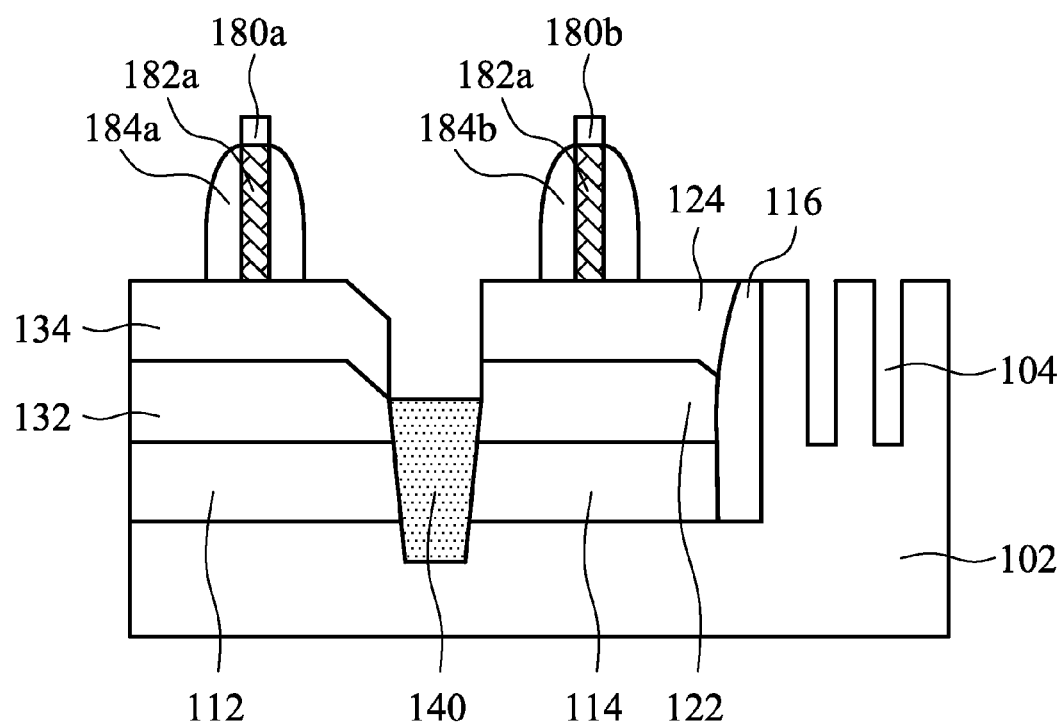

Afterwards, a first dummy gate electrode 182a is formed on the fifth semiconductor material 134, and a second dummy gate electrode 182b is formed on the second semiconductor material 124 as shown in FIG. 3H, in accordance with some embodiments of the disclosure. In other words, the first dummy gate electrode 182a is formed on the fin structure including the fifth semiconductor material 134, and the second dummy gate electrode 182b is formed on the fin structure including the second semiconductor material 124.

Afterwards, a top portion of the isolation structure 140 is removed. The first sidewall spacers 184a are formed on the sidewalls of the first dummy gate electrode 182a, and the second sidewall spacers 184b are formed on the sidewalls of the second dummy gate electrode 182b. A first hard mask layer 182a is formed on the first dummy gate electrode 182a, and the second hard mask layer 182b is formed on the second dummy gate electrode 182b.

Figure 3I:
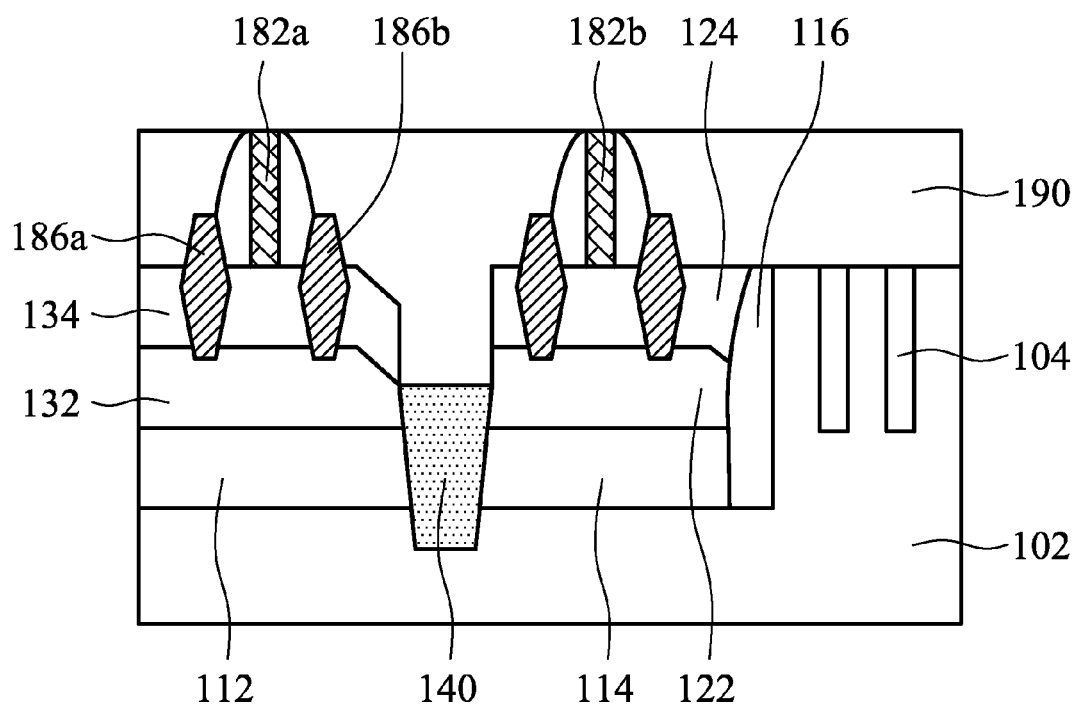

Afterwards, the first source/drain (S/D) structures 186a, the second S/D structures 186b and an ILD layer 190 are formed as shown in FIG. 3I, in accordance with some embodiments of the disclosure.

At the left side of the isolation structure 140, the first S/D structures 186a are formed in the fifth semiconductor material 134. The first S/D structures 186a are adjacent to the first sidewall spacers 184a. At the right side of the isolation structure 140, the second S/D structures 186b are formed in the second semiconductor material 124.

Figure 3J:
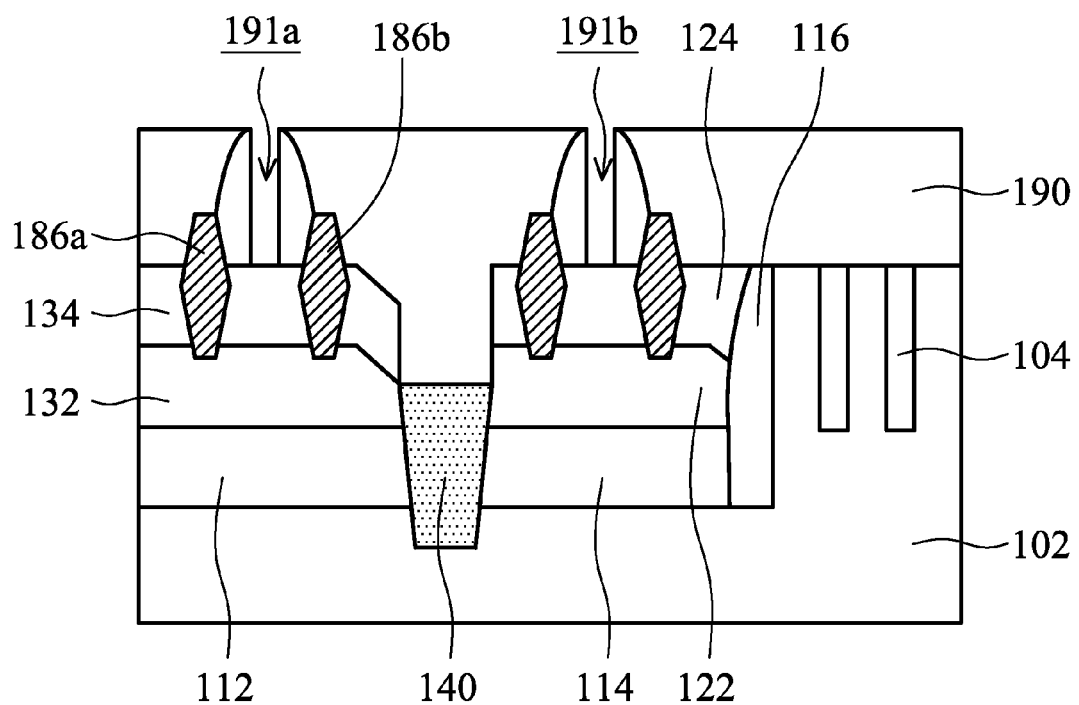

After the ILD layer 190 is formed, the first dummy gate electrode 182a and the second dummy gate electrode 182b are removed as shown in FIG. 3J, in accordance with some embodiments of the disclosure. As a result, a first trench 191a is formed by removing the first dummy gate electrode 182a, and the second trench 191b is formed by removing the second dummy gate electrode 182b.

Figure 3K:
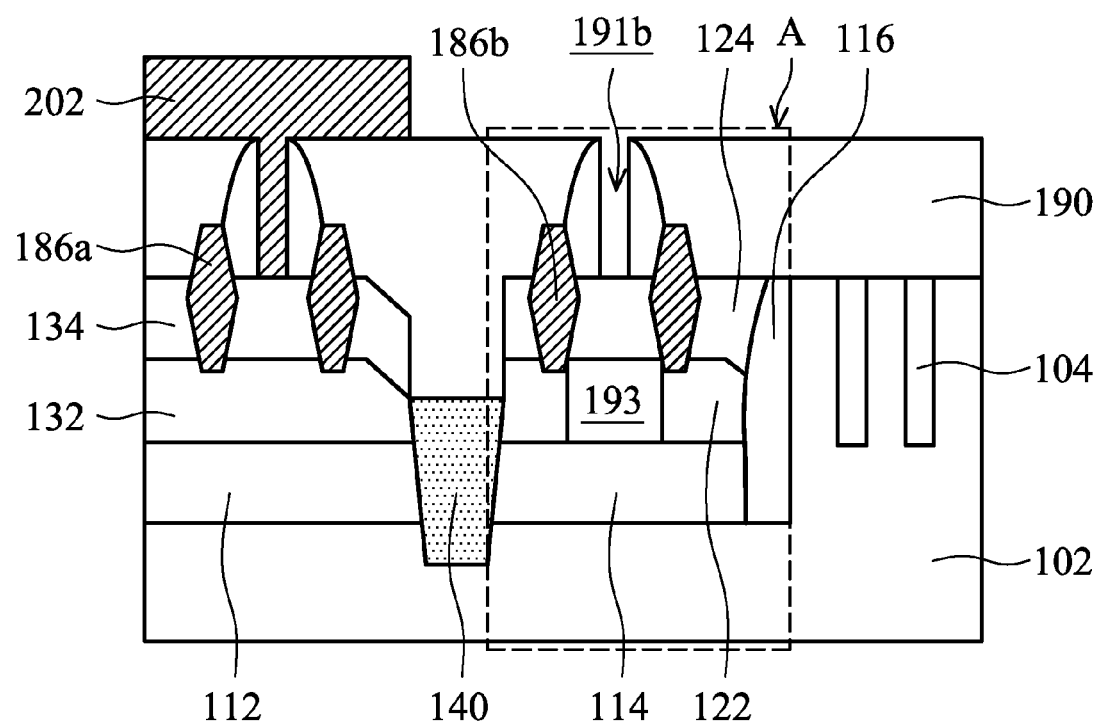
Figure 3K:
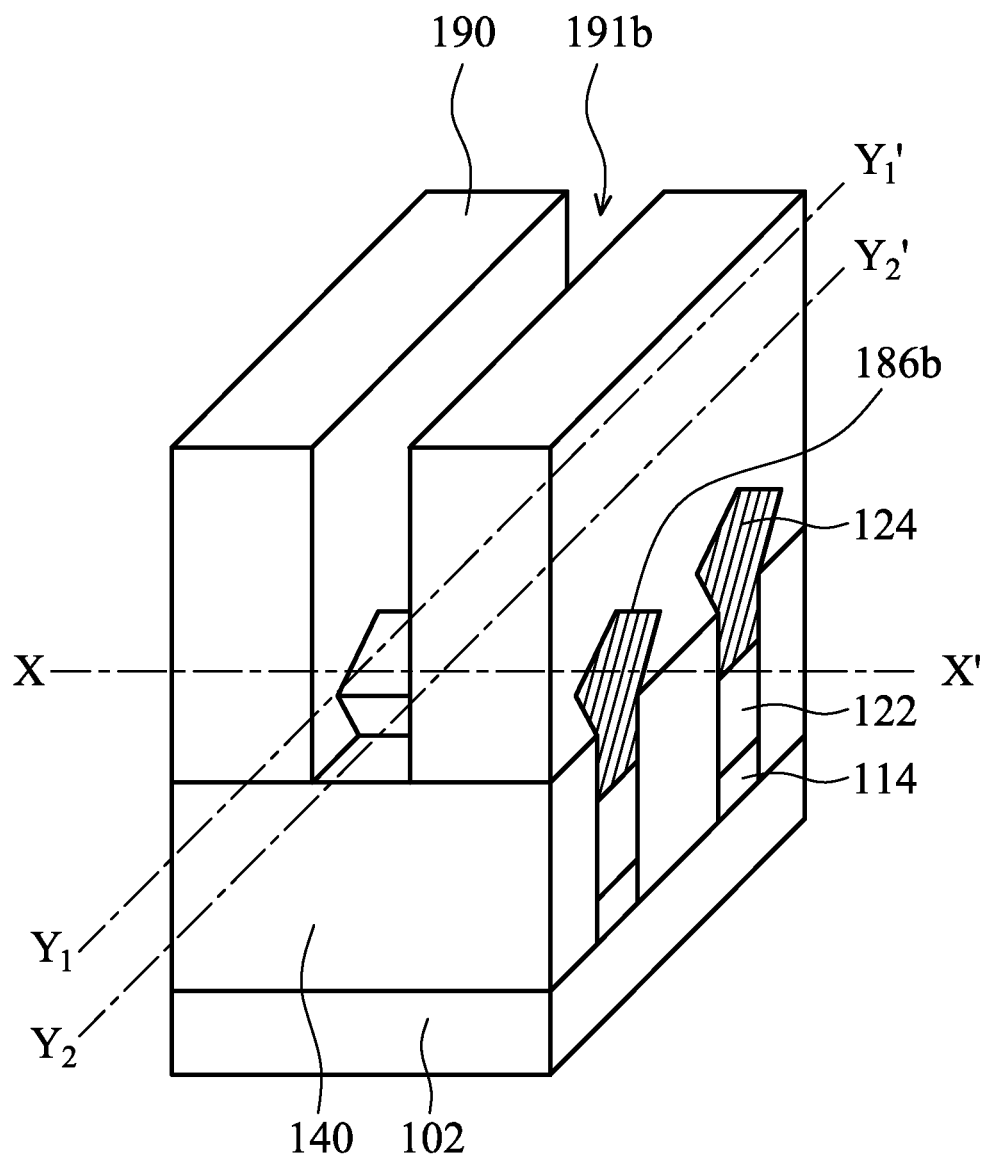

Afterwards, a photoresist layer 202 is formed on the first trench 191a and on a portion of the ILD layer 190 as shown in FIG. 3K, in accordance with some embodiments of the disclosure. Afterwards, a portion of the first material 122 is removed to form a cavity 193 under the second material 124.

FIG. 3K' shows a perspective representation of region A of the FIG. 3K, in accordance with some embodiments of the disclosure. FIG. 3K is a cross-section representation along the line XX' of FIG. 3K'. As shown in FIG. 3K', the second trench 191a is formed in the ILD layer 190.

Figures 1, 3K:
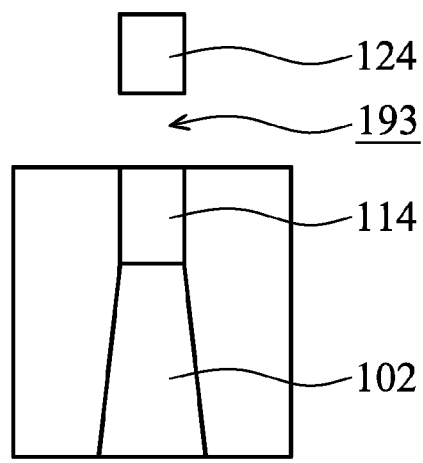

FIG. 3K-1 shows a cross-section representation along the line $Y_1Y_1'$ of FIG. 3K'. The cavity 193 is formed between the second semiconductor material 124 and the second conductive type well region 114.

Figures 2, 3K:
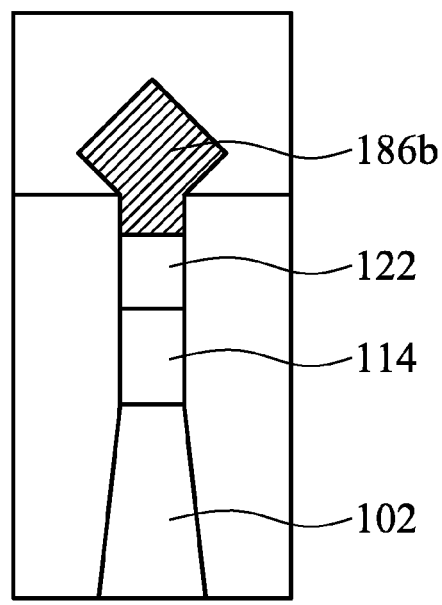

FIG. 3K-2 shows a cross-section representation along the line $Y_2Y_2'$ of FIG. 3K'. The second S/D structures 186b are formed on the first semiconductor material 122.

Figure 3L:
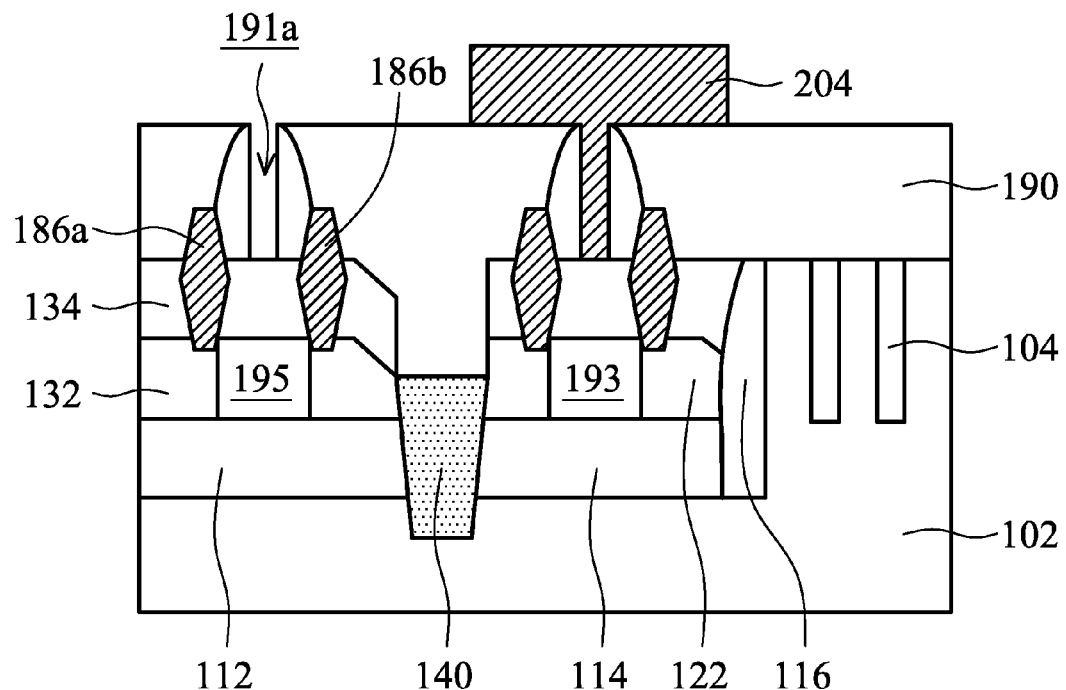

Afterwards, the photoresist layer 202 is removed, and another photoresist layer 204 is filled in the second trench 191b as shown in FIG. 3L, in accordance with some embodiments of the disclosure. Afterwards, a portion of the first semiconductor material 122 is removed to form a cavity 195 under the fourth material 134.

Figure 3M:
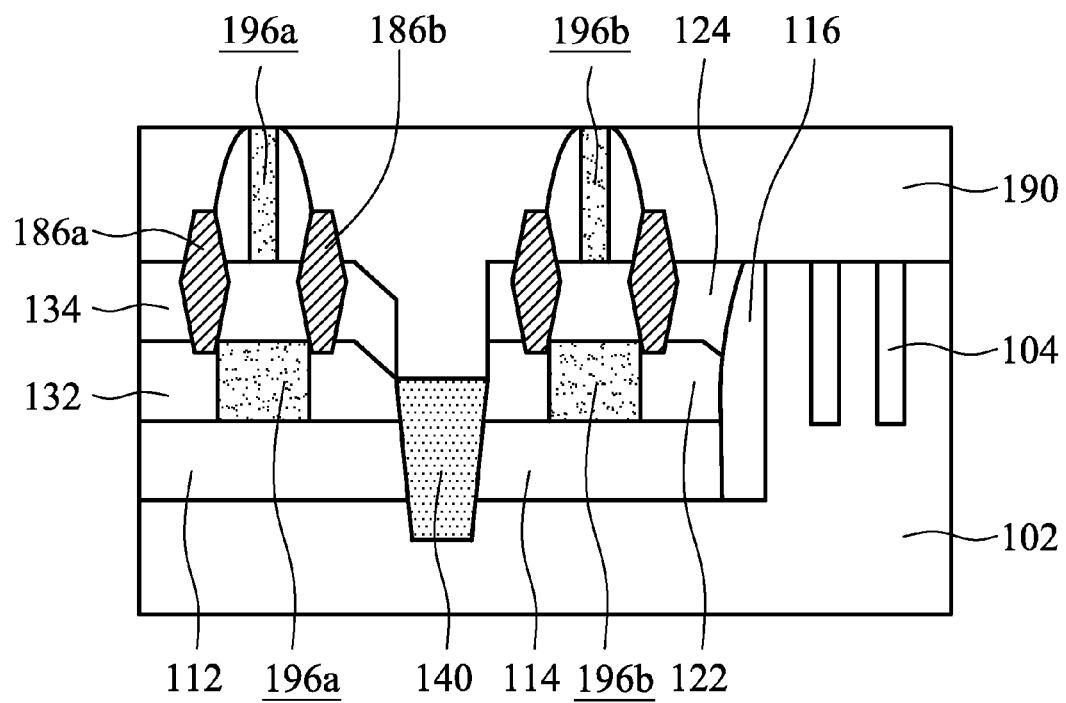
Figures 1, 3M:
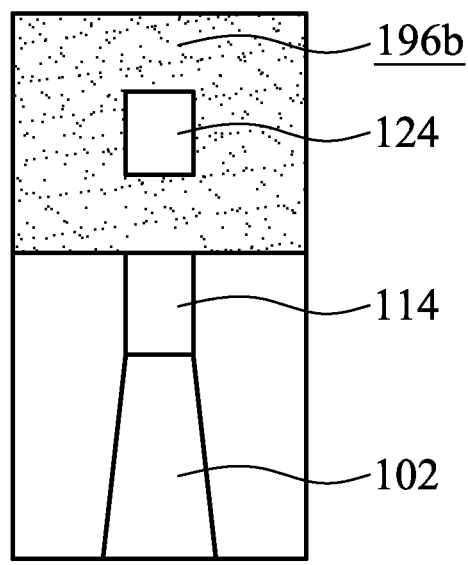

Afterwards, a first gate stack electrode 196a and a second gate stack structure 196b are filled into the first trench 191a and the second trench 191b as shown in FIG. 3M, in accordance with some embodiments of the disclosure. In some embodiments, the first gate stack electrode 196a and the second gate stack structure 196b each includes a high-k dielectric layer (not shown) and a metal layer.

FIG. 3M-1 shows a cross-section representation along the line $Y_1Y_1'$ of FIG. 3K' after formation of the second gate stack structure 196b, in accordance with some embodiments of the disclosure. It should be noted that the second gate stack structure 196b encircles the second semiconductor 124, and therefore a gate all around (GAA) structure is obtained.

Figure 4A:
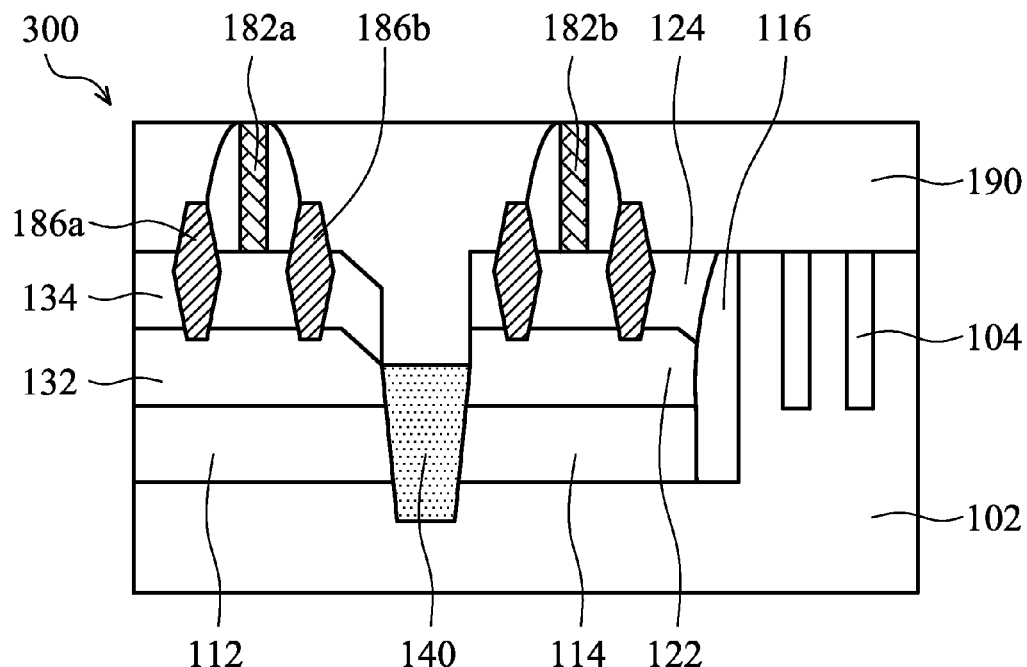
FIGS. 4A-4C show cross-sectional representations of various stages of forming a fin field effect transistor (FinFET) device structure, in accordance with some embodiments of the disclosure.
Figure 4B:
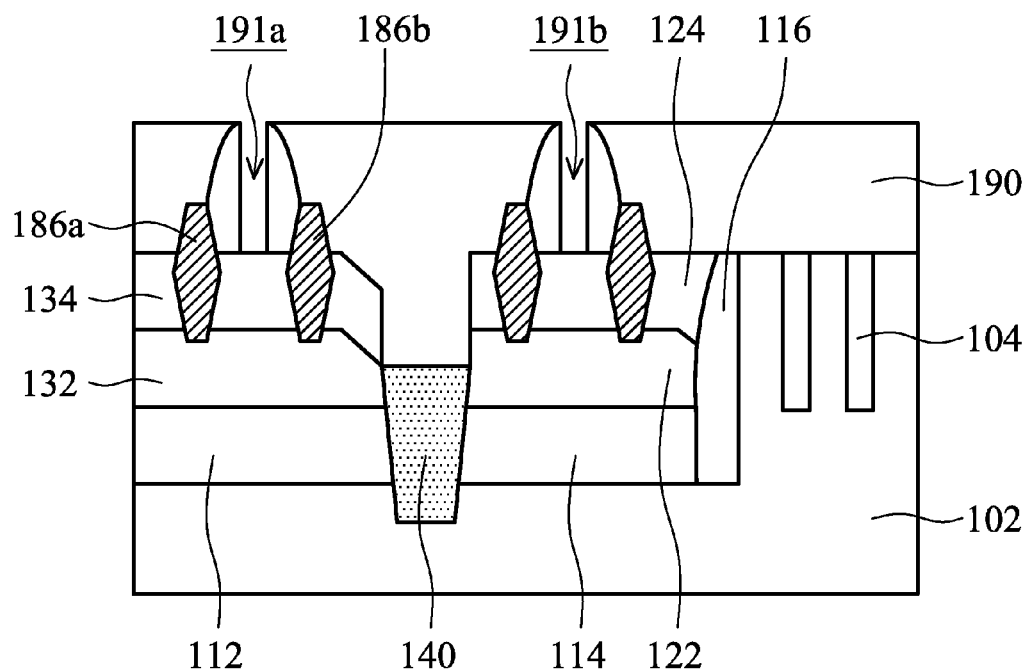
Figure 4C:
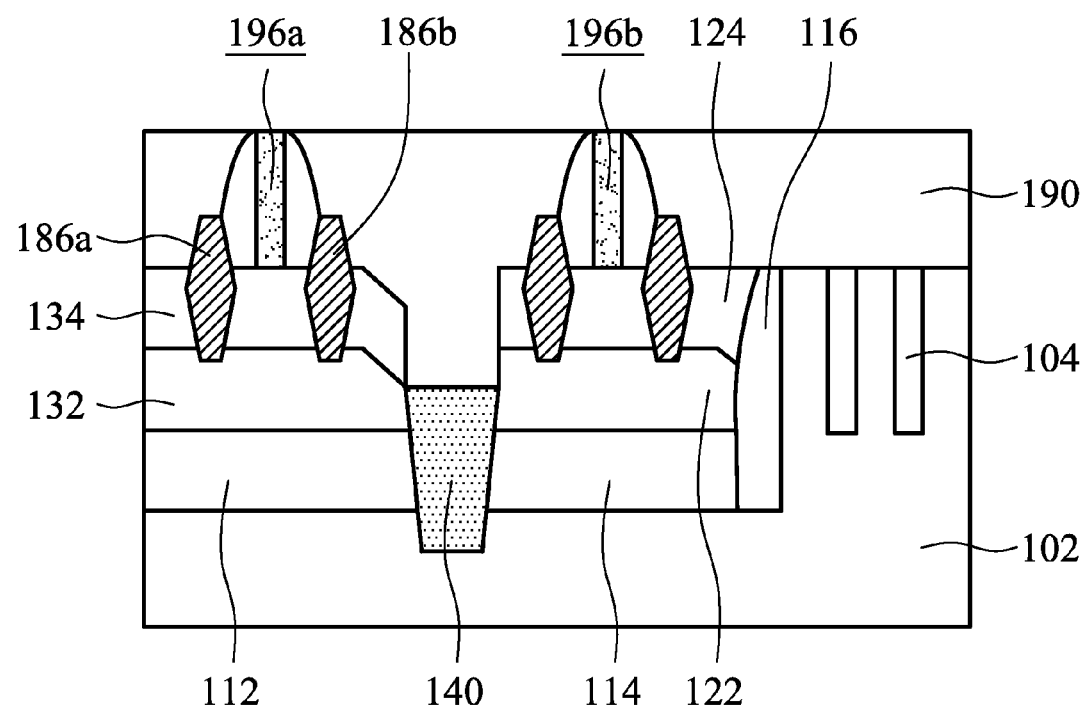

FIGS. 4A-4C show cross-sectional representations of various stages of forming a fin field effect transistor (FinFET) device structure 300, in accordance with some embodiments of the disclosure.

Referring to FIG. 4A, the isolation structure 140 is formed between the first conductive type well region 112 and the second conductive type well region 114. The fifth semiconductor material 134 is formed on the fourth semiconductor material 132, and the fourth semiconductor material 132 is formed on the first conductive type well region 112. The first dummy gate electrode 182a is formed on the fifth semiconductor material 134. The ILD layer 190 is formed on the isolation structure 140. The first dummy gate electrode 182a and the second dummy gate electrode 182b are formed in the ILD layer 190.

In some embodiment, the channel region below the first dummy gate electrode 182a is made of the combination of the fourth semiconductor material 132 and the fifth semiconductor material 134 or the combination of the first semiconductor material 122 and the second semiconductor material 124. In some other embodiments, the channel region below the first dummy gate electrode 182a is made of the first semiconductor material 122 or the fourth semiconductor material 132.

It should be noted that the fifth semiconductor material 134 has a horizontal portion 134a and a sloped portion 134b sloping downward toward the isolation structure 140.

After the ILD layer 190 is formed, the first dummy gate electrode 182a and the second dummy gate electrode 182b are removed as shown in FIG. 4B, in accordance with some embodiments of the disclosure. As a result, the first trench 191a and the second trench 191b are obtained.

Afterwards, the first gate stack electrode 196a and the second gate stack structure 196b are filled into the first trench 191a and the second trench 191b as shown in FIG. 4C, in accordance with some embodiments of the disclosure. In some embodiments, the first gate stack electrode 196a and the second gate stack structure 196b each includes a high-k dielectric layer (not shown) and a metal layer.

It should be noted that the fifth semiconductor 134 has a horizontal portion and a sloped portion sloping downward toward the isolation structure 140 and the ILD layer 190. The channel length uniformity is improved by the downward-sloping portion.

Embodiments for forming a gate all around (GAA) device structure, vertical gate all around (VGAA) device structure, horizontal gate all around (HGAA) device structure and fin field effect transistor (FinFET) device structure are provided. The GAA device structure includes a vertical structure formed on a substrate. The vertical structure includes a source region, a channel region and the drain region which are formed by the epitaxial processes. The source region, the source /the channel region or the source /the channel /the drain region has a horizontal portion and a downward-sloping portion. The vertical gate all around (VGAA) device structure includes a fin structure including a first semiconductor material and a second semiconductor material over the first semiconductor material. The second material includes a horizontal portion and a downward-sloping portion. The channel length uniformity is improved by the downward-sloping portion. Therefore, the performance of the semiconductor device structure and the VGAA device structure are improved.

In some embodiments, a vertical gate all around (VGAA) device structure is provided. The VGAA device structure includes a substrate and an isolation structure formed in the substrate. The VGAA device structure also includes a first transistor structure formed on the substrate, and the first transistor structure includes a vertical structure. The vertical structure includes a source region, a channel region and a drain region, and the channel region is formed between the source region and the drain region. The channel region has a horizontal portion and a sloped portion sloping downward toward the isolation structure. The VGAA device structure further includes a gate stack wrapping around the channel region.

In some embodiments, a horizontal gate all around (HGAA) d device structure is provided. The HGAA device structure includes a substrate and an isolation structure formed on the substrate. The HGAA device structure also includes a fin structure extending above the substrate, and the fin structure includes a first semiconductor material and a second semiconductor material over the first semiconductor material. The HGAA device structure includes a gate stack structure encircling a portion of the second semiconductor material, and the second material includes a horizontal portion and a sloped portion, and the sloped portion sloping downward toward the isolation structure.

In some embodiments, a fin field effect transistor (FinFET) device structure is provided. The FinFET device structure includes a substrate and an isolation structure formed on the substrate. The FinFET device structure includes a fin structure extending above the substrate, and the fin structure includes a first semiconductor material and a second semiconductor material over the first semiconductor material. The FinFET device structure further includes a gate stack structure formed on the fin structure, and the second semiconductor material includes a horizontal portion and a sloped portion sloping downward toward the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical gate all around (GAA) device structure, comprising:
    a substrate;
    an isolation structure formed in the substrate;
    a first transistor structure formed on the substrate, wherein the first transistor structure comprises a vertical structure, and the vertical structure comprises a source region, a channel region and a drain region, and wherein the channel region is formed between the source region and the drain region, and the channel region has a horizontal portion and a sloped portion sloping downward toward the isolation structure, the sloped portion comprises a first sidewall sloping downward toward the isolation structure and adjoining the source region and a second sidewall sloping downward toward the isolation structure and adjoining the drain region, the first sidewall is spaced apart from the second sidewall, and the first sidewall and the second sidewall overlap from a top view of the vertical gate all around (GAA) device structure; and
    a gate stack structure wrapping around the channel region.

2. The vertical gate all around (GAA) device structure as claimed in claim 1, wherein a first distance between the horizontal portion of the channel region and the substrate is greater than a second distance between the sloped portion of the channel region and the substrate.

3. The vertical gate all around (GAA) device structure as claimed in claim 1, wherein the vertical structure has a circular shape, a bar-like shape when seen from a top-view.

4. The vertical gate all around (GAA) device structure as claimed in claim 1, wherein the source region has a horizontal portion and a sloped downward portion.

5. The vertical gate all around (GAA) device structure as claimed in claim 1, wherein the drain region has a horizontal portion and a sloped portion.

6. The vertical gate all around (GAA) device structure as claimed in claim 1, wherein the gate stack structure comprises a high-k dielectric layer and a metal gate electrode.

7. The vertical gate all around (GAA) device structure as claimed in claim 1, further comprising:
    a second transistor structure formed on the substrate, wherein the isolation structure is formed between the first transistor structure and the second transistor structure, and wherein
    the second transistor structure comprises a second vertical structure, and the second vertical structure comprises a source region, a channel region and a drain region, and wherein the channel region of the second transistor structure is formed between the source region and the drain region, and wherein the channel region of the second transistor structure has a horizontal portion and a downward-sloping portion.

8. The vertical gate all around (GAA) device structure as claimed in claim 7, wherein the first transistor structure is a PMOS transistor structure and the second transistor structure is a NMOS transistor structure.

9. The vertical gate all around (GAA) device structure as claimed in claim 1, wherein the source region is made of a first epitaxial material, the channel region is made of a second epitaxial material, and the drain region is made of a third epitaxial material.

10. The vertical gate all around (GAA) device structure as claimed in claim 9, wherein the first epitaxial material, the second epitaxial material and the third epitaxial material each independently comprises Si, Ge, SiGe, SiC, InSb, InAs, GaAs, GaSb, InGaSb, InGaAs, or combinations thereof.

11. The vertical gate all around (GAA) device structure as claimed in claim 1, further comprising:
    gate spacers formed between the source region and the gate stack structure or between the drain region and the gate stack structure.

12. The vertical gate all around (GAA) device structure as claimed in claim 7, further comprising:
    an ILD layer formed over the isolation structure and between the first transistor structure and the second transistor structure.

13. The vertical gate all around (GAA) device structure as claimed in claim 1, further comprising:
    a well region formed in the substrate, wherein the first transistor structure is formed on the well region.

14. A vertical gate all around (GAA) device structure, comprising:
    a substrate;
    an isolation structure formed in the substrate;
    an ILD layer formed over the isolation structure;
    a vertical structure formed on the substrate, wherein the vertical structure comprises a sloped region which is sloping downward toward the isolation structure, and the sloped region is in direct contact with the ILD layer; and
    a gate stack structure adjoining a portion of the sloped region.

15. The vertical gate all around (GAA) device structure as claimed in claim 14, wherein the sloped region is not parallel to a top surface of the isolation structure.

16. The vertical gate all around (GAA) device structure as claimed in claim 14, wherein the sloped region is higher than a top surface of the isolation structure.

17. The vertical gate all around (GAA) device structure as claimed in claim 14, further comprising:
   a gate spacer formed over the isolation structure.

18. A vertical gate all around (GAA) device structure, comprising:
   a substrate;
   a first vertical structure formed on the substrate;
   a second vertical structure formed on the substrate;
   an isolation structure formed in the substrate, wherein the isolation structure is formed between the first vertical structure and the second vertical structure, the first vertical structure comprise a first sloped region toward the isolation structure, the second vertical structure comprise a second sloped region far away from the isolation structure, the first sloped portion comprises a first sidewall sloping downward toward the isolation structure and adjoining the source region and a second sidewall sloping downward toward the isolation structure and adjoining the drain region, the first sidewall is spaced apart from the second sidewall, and the first sidewall and the second sidewall overlap from a top view of the vertical gate all around (GAA) device structure;
   a first gate stack structure wrapping around the first sloped region; and
   a second gate stack structure wrapping around the second sloped region.

19. The vertical gate all around (GAA) device structure as claimed in claim 18, wherein the first vertical structure further comprises a source region and a drain region, and the first sloped region is formed between the source region and the drain region.

20. The vertical gate all around (GAA) device structure as claimed in claim 18, wherein the substrate comprise a lower portion and an upper portion, the second vertical structure is formed on the lower portion and the second sloped region sloping downward toward the upper portion.

\* \* \* \* \*